(12) United States Patent
Tamada

(10) Patent No.: US 11,930,714 B2
(45) Date of Patent: Mar. 12, 2024

(54) PIEZOELECTRIC FILM

(71) Applicant: FUJIFILM Corporation, Tokyo (JP)

(72) Inventor: Yoshinori Tamada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 230 days.

(21) Appl. No.: 17/551,206

(22) Filed: Dec. 15, 2021

(65) Prior Publication Data

US 2022/0109096 A1    Apr. 7, 2022

Related U.S. Application Data

(63) Continuation of application No. PCT/JP2020/021306, filed on May 29, 2020.

(30) Foreign Application Priority Data

Jun. 28, 2019 (JP) ................................ 2019-121161

(51) Int. Cl.
*H10N 30/87* (2023.01)
*H10N 30/857* (2023.01)
*H10N 30/88* (2023.01)

(52) U.S. Cl.
CPC ......... *H10N 30/874* (2023.02); *H10N 30/857* (2023.02); *H10N 30/883* (2023.02)

(58) Field of Classification Search
None
See application file for complete search history.

(56) References Cited

U.S. PATENT DOCUMENTS 4,732,717 A * 3/1988 Yanagida ............. H10N 30/092
 204/192.18
5,796,207 A * 8/1998 Safari .................. H10N 30/852
 310/357

(Continued)

FOREIGN PATENT DOCUMENTS

JP  2011216661  10/2011
JP  2014162685  9/2014

(Continued)

OTHER PUBLICATIONS

Office Action of Taiwan Counterpart Application, with English translation thereof, dated Jul. 19, 2023, pp. 1-9.

(Continued)

*Primary Examiner* — Isam A Alsomiri
*Assistant Examiner* — Jonathan D Armstrong
(74) *Attorney, Agent, or Firm* — JCIPRNET

(57) ABSTRACT

Provided is a piezoelectric film capable of realizing an electroacoustic conversion film or the like in which the durability is high and a sufficient sound pressure with respect to an input operating voltage is obtained. The piezoelectric film is a piezoelectric film including a polymer-based piezoelectric composite material which contains piezoelectric particles in a matrix containing a polymer material, and electrode layers which are provided on both surfaces of the polymer-based piezoelectric composite material, in which in a case where a cross section of the piezoelectric film in a thickness direction is observed with a scanning electron microscope, the polymer-based piezoelectric composite material is divided into two equal regions in the thickness direction, and void volumes of the two regions are measured, a ratio of the void volume obtained by dividing the void volume of the region with a larger void volume by the (Continued)

void volume of the region with a smaller void volume is 1.2 or greater.

20 Claims, 4 Drawing Sheets

(56) References Cited

U.S. PATENT DOCUMENTS

| | | | | |
|---|---|---|---|---|
| 5,951,908 | A * | 9/1999 | Cui | H10N 30/852 |
| | | | | 524/413 |
| 6,136,029 | A * | 10/2000 | Johnson | A61L 27/425 |
| | | | | 427/2.27 |
| 6,296,667 | B1 * | 10/2001 | Johnson | A61L 27/425 |
| | | | | 623/23.61 |
| 6,977,095 | B1 * | 12/2005 | Marx | A61L 27/425 |
| | | | | 427/247 |
| 8,536,766 | B2 | 9/2013 | Uetani et al. | |
| 9,621,997 | B2 | 4/2017 | Miyoshi et al. | |
| 2010/0010750 | A1 * | 1/2010 | Baron | G01N 29/032 |
| | | | | 702/30 |
| 2014/0134418 | A1 | 5/2014 | Lee et al. | |
| 2014/0260653 | A1 * | 9/2014 | Merrell | G01L 1/16 |
| | | | | 73/774 |
| 2014/0333184 | A1 | 11/2014 | Wang et al. | |
| 2015/0200351 | A1 * | 7/2015 | Zawada | H10N 30/852 |
| | | | | 252/62.9 PZ |
| 2015/0364674 | A1 | 12/2015 | Sasaki et al. | |
| 2016/0014526 | A1 | 1/2016 | Miyoshi et al. | |
| 2017/0373243 | A1 * | 12/2017 | Ozawa | B06B 1/0607 |
| 2023/0122929 | A1 * | 4/2023 | Vella | C08L 71/02 |
| | | | | 264/401 |
| 2023/0266291 | A1 * | 8/2023 | Myrick | H01L 31/107 |
| | | | | 422/98 |

FOREIGN PATENT DOCUMENTS

| | | |
|---|---|---|
| JP | 2014212307 | 11/2014 |
| JP | 2017152468 | 8/2017 |
| TW | 201418047 | 5/2014 |
| WO | 2011122416 | 10/2011 |
| WO | 2014162976 | 10/2014 |
| WO | 2016017632 | 2/2016 |

OTHER PUBLICATIONS

"Search Report of Europe Counterpart Application", dated Nov. 2, 2022, pp. 1-11.
"Office Action of Japan Counterpart Application" with English translation thereof, dated Oct. 25, 2022, p. 1-p. 8.
"International Search Report (Form PCT/ISA/210) of PCT/JP2020/021306," dated Aug. 4, 2020, with English translation thereof, pp. 1-6.
"Written Opinion of the International Searching Authority (Form PCT/ISA/237)" of PCT/JP2020/021306, dated Aug. 4, 2020, with English translation thereof, pp. 1-8.
"Office Action of China Counterpart Application", dated Oct. 4, 2023, with English translation thereof, p. 1-p. 15.
Office Action of Taiwan Counterpart Application, with English translation thereof, dated Nov. 9, 2023, pp. 1-11.
Office Action of Korean Counterpart Application, with English translation thereof, dated Nov. 14, 2023, pp. 1-8.

* cited by examiner

PIEZOELECTRIC FILM

CROSS-REFERENCE TO RELATED APPLICATIONS

This application is a Continuation of PCT International Application No. PCT/JP2020/021306 filed on May 29, 2020, which claims priority under 35 U.S.C. § 119(a) to Japanese Patent Application No. 2019-121161 filed on Jun. 28, 2019. The above application is hereby expressly incorporated by reference, in its entirety, into the present application.

BACKGROUND OF THE INVENTION

1. Field of the Invention

The present invention relates to a piezoelectric film used for an electroacoustic conversion film or the like.

2. Description of the Related Art

With reduction in thickness and weight of displays such as liquid crystal displays or organic electroluminescence (EL) displays, speakers used in these thin displays are also required to be thinner and lighter. Further, with the development of flexible displays formed of flexible substrates such as plastics, speakers used in the flexible displays are also required to be flexible.

Examples of typical shapes of speakers of the related art include a funnel-like so-called cone shape and a spherical dome shape. However, in a case where such a speaker is intended to be incorporated in the above-described thin display, there is a concern that the lightness and the flexibility of the speaker are impaired because the speaker cannot be sufficiently made thin. Further, in a case where the speaker is attached externally, it is troublesome to carry the speaker.

Therefore, as a speaker that is thin and can be integrated into a thin display or a flexible display without impairing lightness and flexibility, a sheet-like piezoelectric film having flexibility and a property of stretching and contracting in response to an applied voltage has been suggested.

For example, a piezoelectric film (electroacoustic conversion film) disclosed in JP2014-212307A has been suggested as a sheet-like piezoelectric film that has flexibility and can stably reproduce a high-quality sound.

For example, the piezoelectric film disclosed in JP2014-212307A includes a polymer-based piezoelectric composite material obtained by dispersing piezoelectric particles in a viscoelastic matrix consisting of a polymer material having a viscoelasticity at room temperature, and electrode layers provided to sandwich the polymer-based piezoelectric composite material. The piezoelectric film described in JP2014-212307A includes a protective layer formed on the surface of a thin film electrode as a preferred aspect.

SUMMARY OF THE INVENTION

Such a piezoelectric film functions as a piezoelectric speaker by, for example, being maintained in a bent state.

That is, by maintaining the piezoelectric film in a bent state and applying a driving voltage to the electrode layer, the polymer-based piezoelectric composite material stretches and contracts due to the stretch and contraction of the piezoelectric particles and the piezoelectric film vibrates to absorb the stretch and contraction in a direction orthogonal to the surface. The piezoelectric film vibrates the air through this vibration and converts an electric signal into a sound.

The expression of "the piezoelectric film vibrates in a direction orthogonal to the surface" indicates that a state where the polymer-based piezoelectric composite material constituting the piezoelectric film is greatly warped in a direction orthogonal to the surface and a state where the polymer-based piezoelectric composite material is returned to the original state are repeated.

In the state where the polymer-based piezoelectric composite material is warped in a direction orthogonal to the surface, the polymer-based piezoelectric composite material has a region where the degree of a volume change varies in the thickness direction. That is, in the state where the polymer-based piezoelectric composite material is warped, the volume thereof on a projection side is large and the volume thereof on a recess side is small.

Due to such a difference in volume change in the thickness direction, a large stress such as deformation or distortion is imparted to the polymer-based piezoelectric composite material, and defects such as cracking and peeling of the piezoelectric film from the electrode layer occur. Therefore, as the piezoelectric film is used, deterioration of acoustic characteristics such as a decrease in sound pressure occurs.

However, in the piezoelectric film of the related art, deterioration of acoustic characteristics due to defects caused by the stress imparted to the polymer-based piezoelectric composite material has not been sufficiently considered.

The present invention has been made to solve such problems of the related art, and an object thereof is to provide a piezoelectric film which has satisfactory durability to prevent occurrence of defects due to a stress imparted to a polymer-based piezoelectric composite material and has a satisfactory acoustic characteristic of obtaining a sufficient sound pressure with respect to an input operating voltage.

In order to solve the above-described problem, the present invention has the following configurations.

[1] A piezoelectric film comprising: a polymer-based piezoelectric composite material which contains piezoelectric particles in a matrix containing a polymer material; and electrode layers which are provided on both surfaces of the polymer-based piezoelectric composite material, in which in a case where a cross section of the piezoelectric film in a thickness direction is observed with a scanning electron microscope, the polymer-based piezoelectric composite material is divided into two equal regions in the thickness direction, and void volumes of the two regions are measured, a ratio of the void volume obtained by dividing the void volume of the region with a larger void volume by the void volume of the region with a smaller void volume is 1.2 or greater.

[2] The piezoelectric film according to [1], in which an average of the void volumes of the two regions is 30% or less.

[3] The piezoelectric film according to [1] or [2], further comprising: a protective layer laminated on a surface of at least one electrode layer.

[4] The piezoelectric film according to [3], in which the protective layers are provided on surfaces of both the electrode layers.

[5] The piezoelectric film according to any one of [1] to [4], in which the piezoelectric film is polarized in a thickness direction.

[6] The piezoelectric film according to any one of [1] to [5], in which the piezoelectric film has no in-plane anisotropy as a piezoelectric characteristic.

[7] The piezoelectric film according to any one of [1] to [6], in which the polymer material contains a cyanoethyl group.

[8] The piezoelectric film according to [7], in which the polymer material is cyanoethylated polyvinyl alcohol.

[9] The piezoelectric film according to any one of [1] to [8], in which the piezoelectric particles consist of ceramic particles having a perovskite-type or wurtzite-type crystal structure.

Such a piezoelectric film of the present invention has satisfactory durability to prevent occurrence of defects due to a stress imparted to the polymer-based piezoelectric composite material and has a satisfactory acoustic characteristic of obtaining a sufficient sound pressure with respect to an input operating voltage.

DESCRIPTION OF THE PREFERRED EMBODIMENTS

Figure 1:
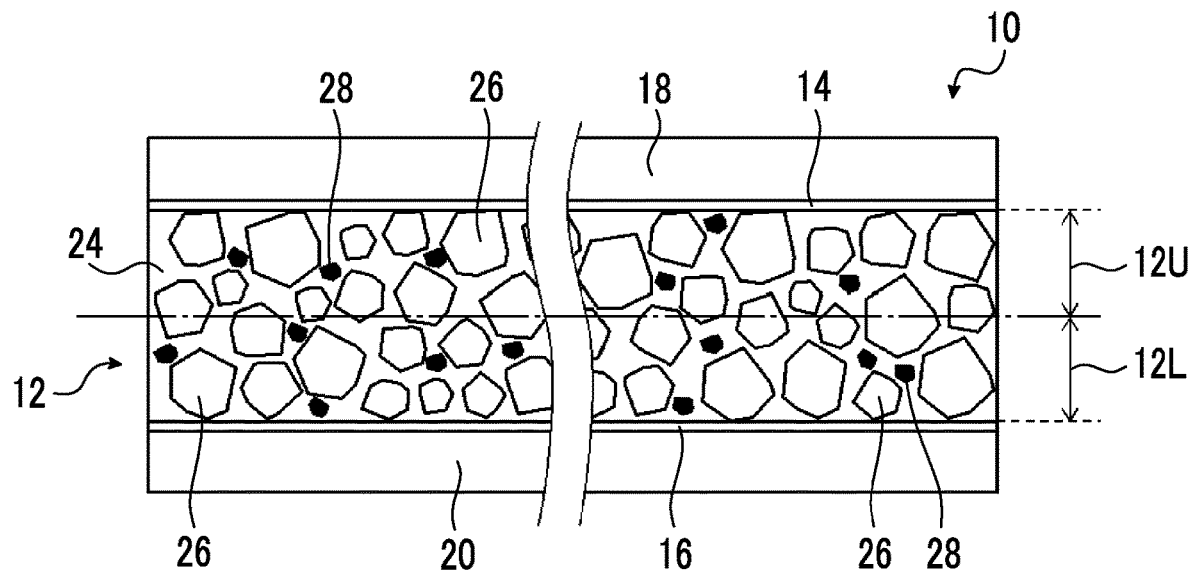
FIG. 1 is a cross-sectional view conceptually illustrating an example of the piezoelectric film according to the embodiment of the present invention.

Hereinafter, the piezoelectric film of the present invention will be described in detail based on the preferred embodiments shown in the accompanying drawings.

Descriptions of the constituent requirements described below may be made based on representative embodiments of the present invention, but the present invention is not limited to such embodiments.

In the present specification, a numerical range shown using "to" indicates a range including numerical values described before and after "to" as a lower limit and an upper limit.

In addition, the figures shown below are conceptual views for describing the present invention, and the thickness of each layer, the size of the piezoelectric particles, the size of the constituent members, and the like are different from the actual values.

A piezoelectric film according to the embodiment of the present invention includes electrode layers on both surfaces of the polymer-based piezoelectric composite material and a protective layer on the surface of at least one electrode layer. The polymer-based piezoelectric composite material is a material containing piezoelectric particles in a matrix containing a polymer material. Further, it is preferable that the piezoelectric film according to the embodiment of the present invention further includes protective layers on the surfaces of both the electrode layers.

In such a piezoelectric film according to the embodiment of the present invention, in a case where a cross section of the piezoelectric film in a thickness direction is observed with a scanning electron microscope (SEM), the polymer-based piezoelectric composite material is divided into two equal regions in the thickness direction, and the void volumes of the two equal regions are measured, the ratio obtained by dividing the void volume of the region with a larger void volume by the void volume of the region with a smaller void volume is 1.2 or greater.

In the following description, the "cross section" indicates a cross section of the piezoelectric film in the thickness direction unless otherwise specified. The thickness direction of the piezoelectric film is the lamination direction of each layer.

The piezoelectric film according to the embodiment of the present invention is used, for example, as an electroacoustic conversion film. Specifically, the piezoelectric film according to the embodiment of the present invention is used as a vibration plate of an electroacoustic converter such as a piezoelectric speaker, a microphone, or a voice sensor.

In an electroacoustic converter, in a case where the piezoelectric film is stretched in the in-plane direction due to application of a voltage to the piezoelectric film, the piezoelectric film moves upward (in the radiation direction of the sound) in order to absorb the stretched part. On the contrary, in a case where the piezoelectric film is contracted in the in-plane direction due to application of a voltage to the piezoelectric film, the piezoelectric film moves downward in order to absorb the contracted part.

The electroacoustic converter converts vibration (sound) and an electric signal using vibration caused by repeated stretch and contraction of the piezoelectric film. The electroacoustic converter inputs an electric signal to the piezoelectric film to reproduce a sound due to the vibration of the piezoelectric film in response to the electric signal and converts the vibration of the piezoelectric film to an electric signal by receiving a sound wave. In addition to the electroacoustic converter, the piezoelectric film can be used to apply tactile sensation or transport an object through the vibration.

Specific suitable examples of the applications of the piezoelectric film include various sensors such as sonic sensors, ultrasonic sensors, pressure sensors, tactile sensors, strain sensors, and vibration sensors, various acoustic devices such as microphones, pickups, speakers, and exciters, haptics used for automobiles, smartphones, smart watches, and games, ultrasonic converters such as ultrasonic probes and hydrophones, actuators used for preventing adhesion of water droplets, transportation, stirring, dispersion, and polishing, damping materials (dampers) used for sports equipment such as containers, vehicles, buildings, skis, and rackets, and vibration power generators used by being applied to roads, floors, mattresses, chairs, shoes, tires, wheels, and computer keyboards.

Further, specific examples of the applications of the acoustic devices include noise cancellers (used for cars, trains, airplanes, and robots), artificial voice cords, buzzers for preventing invasion of pests and harmful animals, furniture, wallpaper, photos, helmets, goggles, signage, and robot.

FIG. 1 is a cross-sectional view conceptually illustrating an example of the piezoelectric film according to the embodiment of the present invention.

A piezoelectric film 10 illustrated in FIG. 1 includes a piezoelectric layer 12, an upper thin film electrode 14 laminated on one surface of the piezoelectric layer 12, an upper protective layer 18 laminated on the upper thin film electrode 14, a lower thin film electrode 16 laminated on the other surface of the piezoelectric layer 12, and a lower protective layer 20 laminated on the lower thin film electrode 16.

In the piezoelectric film 10, the piezoelectric layer 12 contains piezoelectric particles 26 in a polymer matrix 24 containing a polymer material, as conceptually illustrated in FIG. 1. That is, the piezoelectric layer 12 is a polymer-based piezoelectric composite material in the piezoelectric film according to the embodiment of the present invention.

Further, voids 28 that do not have the piezoelectric particles 26 nor the polymer matrix 24 are present in the piezoelectric layer 12.

Here, it is preferable that the polymer-based piezoelectric composite material (piezoelectric layer 12) satisfies the following requirements. Further, in the present invention, room temperature is in a range of 0° C. to 50° C.

(i) Flexibility

For example, in a case of being gripped in a state of being loosely bent like a document such as a newspaper or a magazine as a portable device, the piezoelectric film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a polymer matrix and piezoelectric particles, which may lead to breakage. Accordingly, the polymer-based piezoelectric composite material is required to have suitable flexibility. In addition, in a case where strain energy is diffused into the outside as heat, the stress can be relieved. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and the vibration energy causes the entire vibration plate (polymer-based piezoelectric composite material) to vibrate integrally so that a sound is reproduced. Therefore, in order to increase the transmission efficiency of the vibration energy, the polymer-based piezoelectric composite material is required to have appropriate hardness. In addition, in a case where the frequencies of the speaker are smooth as the frequency characteristic thereof, an amount of change in acoustic quality in a case where the lowest resonance frequency $f_0$ is changed in association with a change in the curvature of the speaker decreases. Therefore, the loss tangent of the polymer-based piezoelectric composite material is required to be suitably large.

It is known that the lowest resonance frequency $f_0$ of the vibration plate for a speaker is represented by the following equation. Here, s represents the stiffness of the vibration system and m represents the mass.

$$\text{Lowest resonance frequency: } f_0 = \frac{1}{2\pi}\sqrt{\frac{s}{m}}$$

Here, as the degree of curvature of the piezoelectric film, that is, the radius of curvature of the curved portion increases, the mechanical stiffness s decreases, and thus the lowest resonance frequency $f_0$ decreases. That is, the acoustic quality (the volume and the frequency characteristics) of the speaker changes depending on the radius of curvature of the piezoelectric film.

That is, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of a polymer-based piezoelectric composite material is required to be suitably large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among these, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (piezoelectric layer 12), the polymer-based piezoelectric composite material exhibiting a behavior of being rigid with respect to a vibration of 20 Hz to 20 kHz and being flexible with respect to a vibration of less than or equal to a few Hz is realized by using a polymer material whose glass transition point is room temperature, that is, a polymer material having a viscoelasticity at room temperature as a matrix. In particular, from the viewpoint that such a behavior is suitably exhibited, it is preferable that the polymer material in which the glass transition temperature at a frequency of 1 Hz is at room temperature is used for a matrix of the polymer-based piezoelectric composite material.

In the polymer material, it is preferable that the maximal value of a loss tangent Tan δ at a frequency of 1 Hz according to a dynamic viscoelasticity test at room temperature is 0.5 or greater.

In this manner, in a case where the polymer-based piezoelectric composite material is slowly bent due to an external force, stress concentration on the interface between the polymer matrix and the piezoelectric particles at the maximum bending moment portion is relieved, and thus satisfactory flexibility can be expected.

In the polymer material, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being rigid with respect to an acoustic vibration of 20 Hz to 20 kHz.

In addition, it is more suitable that the relative dielectric constant of the polymer material is 10 or greater at 25° C. Accordingly, in a case where a voltage is applied to the polymer-based piezoelectric composite material, a higher electric field is applied to the piezoelectric particles in the polymer matrix, and thus a large deformation amount can be expected.

However, in consideration of ensuring satisfactory moisture resistance and the like, it is suitable that the relative dielectric constant of the polymer material is 10 or less at 25° C.

Suitable examples of the polymer material that satisfies such conditions include cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, and polybutyl methacrylate.

In addition, as these polymer materials, a commercially available product such as Hybrar 5127 (manufactured by Kuraray Co., Ltd.) can be suitably used.

Among these, it is preferable to use a polymer material containing a cyanoethyl group and particularly preferable to use cyanoethylated PVA as the polymer material constituting the polymer matrix 24. That is, in the piezoelectric film 10 according to the embodiment of the present invention, it is preferable to use a polymer material containing a cyanoethyl group and particularly preferable to use cyanoethylated PVA as the polymer matrix 24 of the piezoelectric layer 12.

In the description below, the above-described polymer materials typified by cyanoethylated PVA will also be collectively referred to as the "polymer material having a viscoelasticity at room temperature" for convenience.

Further, the polymer material having a viscoelasticity at room temperature may be used alone or in combination (mixture) of two or more kinds thereof.

In the piezoelectric film 10 according to the embodiment of the present invention, a plurality of polymer materials may be used in combination as necessary for the polymer matrix 24 of the piezoelectric layer 12.

That is, for the purpose of adjusting dielectric characteristics, mechanical characteristics, and the like, other dielectric polymer materials may be added to the polymer matrix 24 constituting the polymer-based piezoelectric composite material in addition to the polymer material having a viscoelasticity at room temperature as necessary.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

Further, in the polymer matrix 24 of the piezoelectric layer 12, the number of these dielectric polymer materials is not limited to one, and a plurality of kinds of dielectric polymer materials may be added.

In addition, for the purpose of adjusting the glass transition point Tg of the polymer matrix 24, the polymer matrix 24 may contain a thermoplastic resin such as a vinyl chloride resin, polyethylene, polystyrene, a methacrylic resin, polybutene, or isobutylene, and a thermosetting resin such as a phenol resin, a urea resin, a melamine resin, an alkyd resin, or mica in addition to the dielectric polymer materials.

Further, for the purpose of improving the pressure sensitive adhesiveness, a viscosity imparting agent such as rosin ester, rosin, terpene, terpene phenol, or a petroleum resin may be added.

In the polymer matrix 24 of the piezoelectric layer 12, the addition amount in a case of adding polymer materials other than the polymer material having a viscoelasticity at room temperature is not particularly limited, but is preferably set to 30% by mass or less in terms of the proportion of the polymer materials in the matrix 24.

In this manner, the characteristics of the polymer material to be added can be exhibited without impairing the viscoelastic relieving mechanism in the polymer matrix 24, and thus preferable results, for example, an increase in the dielectric constant, improvement of the heat resistant, and improvement of the adhesiveness between the piezoelectric particles 26 and the electrode layer can be obtained.

The piezoelectric layer 12 (polymer-based piezoelectric composite material) contains the piezoelectric particles 26 in the polymer matrix.

It is preferable that the piezoelectric particles 26 consist of ceramics particles having a perovskite type or wurtzite type crystal structure.

Examples of the ceramic particles constituting the piezoelectric particles 26 include lead zirconate titanate (PZT), lead lanthanum zirconate titanate (PLZT), barium titanate ($BaTiO_3$), zinc oxide (ZnO), and a solid solution (BFBT) of barium titanate and bismuth ferrite ($BiFe_3$).

The particle diameter of the piezoelectric particles 26 may be appropriately selected according to the size and the applications of the piezoelectric film 10. The particle diameter of the piezoelectric particles 26 is preferably in a range of 1 to 10 μm.

By setting the particle diameter of the piezoelectric particles 26 to be in the above-described range, preferable results in terms of achieving both excellent piezoelectric characteristics and flexibility can be obtained.

In the piezoelectric film 10, the ratio between the amount of the polymer matrix 24 and the amount of the piezoelectric particles 26 in the piezoelectric layer 12 may be appropriately set according to the size and the thickness of the piezoelectric film 10 in the plane direction, the applications of the piezoelectric film 10, the characteristics required for the piezoelectric film 10, and the like.

The volume fraction of the piezoelectric particles 26 in the piezoelectric layer 12 is preferably in a range of 30% to 80% and particularly preferably 50% or greater, and thus the volume fraction thereof is more preferably in a range of 50% to 80%.

By setting the ratio between the amount of the polymer matrix 24 and the amount of the piezoelectric particles 26 to be in the above-described range, preferable results in terms of achieving both of excellent piezoelectric characteristics and flexibility can be obtained.

In the piezoelectric film 10, the thickness of the piezoelectric layer 12 is not limited and may be appropriately set according to the size of the piezoelectric film 10, the applications of the piezoelectric film 10, the characteristics required for the piezoelectric film 10, and the like.

The thickness of the piezoelectric layer 12 is preferably in a range of 8 to 300 μm, more preferably in a range of 8 to 150 μm, still more preferably in a range of 15 to 100 μm, and particularly preferably in a range of 25 to 75 μm.

It is preferable that the piezoelectric layer 12 is subjected to a polarization treatment (poling) in the thickness direction. The polarization treatment will be described in detail later.

The piezoelectric film 10 illustrated in FIG. 1 has a configuration in which the lower thin film electrode 16 is provided on one surface of the piezoelectric layer 12, the lower protective layer 20 is provided on the lower thin film electrode 16 as a preferred embodiment, the upper thin film electrode 14 is provided on the other surface of the piezoelectric layer 12, and the upper protective layer 18 is provided on the upper thin film electrode 14 as a preferred embodiment. In the piezoelectric film 10, the upper thin film electrode 14 and the lower thin film electrode 16 form an electrode pair.

That is, the piezoelectric film 10 according to the embodiment of the present invention has a configuration in which both surfaces of the piezoelectric layer 12 are sandwiched between the electrode pair, that is, the upper thin film electrode 14 and the lower thin film electrode 16 and preferably between the upper protective layer 18 and the lower protective layer 20.

The region sandwiched between the upper thin film electrode 14 and the lower thin film electrode 16 is driven according to the applied voltage.

In the present invention, the terms "upper" and "lower" in the lower thin film electrode 16 and the lower protective layer 20, and the upper thin film electrode 14 and the upper protective layer 18 are provided based on the accompanying drawings for convenience in order to describe the piezoelectric film 10 according to the embodiment of the present invention.

Therefore, the terms "upper" and "lower" in the piezoelectric film 10 according to the embodiment of the present invention have no technical meaning and are irrelevant to the actual use state.

Further, the piezoelectric film 10 according to the embodiment of the present invention may further include a bonding layer for bonding the thin film electrode and the piezoelectric layer 12 to each other and a bonding layer for bonding the thin film electrode and the protective layer to each other, in addition to the above-described layers.

The bonding agent may be an adhesive or a pressure sensitive adhesive. Further, the same material as the polymer material obtained by removing the piezoelectric particles 26 from the piezoelectric layer 12, that is, the polymer matrix 24 can also be suitably used as the bonding agent. Further, the bonding layer may be provided on both the upper thin film electrode 14 side and the lower thin film electrode 16 side or may be provided on only one of the upper thin film electrode 14 side or the lower thin film electrode 16 side.

Further, the piezoelectric film 10 may further include an electrode lead portion that leads out the electrodes from the upper thin film electrode 14 and the lower thin film electrode 16, and an insulating layer which covers a region where the piezoelectric layer 12 is exposed for preventing a short circuit or the like, in addition to the above-described layers.

The electrode lead portion may be configured such that a portion where the thin film electrode and the protective layer project convexly outside the piezoelectric layer in the plane direction is provided or configured such that a part of the protective layer is removed to form a hole portion, and a conductive material such as silver paste is inserted into the hole portion so that the conductive material is conducted with the thin film electrode.

Each thin film electrode may have only one or two or more electrode lead portions. Particularly in a case of the configuration in which the electrode lead portion is obtained by removing a part of the protective layer and inserting a conductive material into the hole portion, it is preferable that the thin film electrode has three or more electrode lead portions in order to more reliably ensure the conduction.

The upper protective layer 18 and the lower protective layer 20 in the piezoelectric film 10 have a function of covering the upper thin film electrode 14 and the lower thin film electrode 16 and applying moderate rigidity and mechanical strength to the piezoelectric layer 12. That is, in the piezoelectric film 10 according to the embodiment of the present invention, the piezoelectric layer 12 containing the polymer matrix 24 and the piezoelectric particles 26 exhibits extremely excellent flexibility under bending deformation at a slow vibration, but may have insufficient rigidity or mechanical strength depending on the applications. As a compensation for this, the piezoelectric film 10 is provided with the upper protective layer 18 and the lower protective layer 20.

The lower protective layer 20 and the upper protective layer 18 have the same configuration except for the disposition position. Therefore, in the description below, in a case where it is not necessary to distinguish the lower protective layer 20 from the upper protective layer 18, both members are collectively referred to as a protective layer.

According to a more preferred embodiment, the piezoelectric film 10 in the example illustrated in the figure has the lower protective layer 20 and the upper protective layer 18 in a manner of being laminated on both thin film electrodes. However, the present invention is not limited thereto, and a configuration having only one of the lower protective layer 20 or the upper protective layer 18 may be employed.

In the piezoelectric film according to the embodiment of the present invention, the protective layer is provided as a preferred embodiment rather than an essential constituent requirement. That is, the piezoelectric film according to the embodiment of the present invention may be formed of the piezoelectric layer 12, the upper thin film electrode 14, and the lower thin film electrode 16.

The protective layer is not limited, and various sheet-like materials can be used as the protective layer, and suitable examples thereof include various resin films. Among these, from the viewpoints of excellent mechanical characteristics and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyamide (PA), polyethylene naphthalate (PEN), triacetyl cellulose (TAC), and a cyclic olefin-based resin is suitably used.

The thickness of the protective layer is not limited. In addition, the thicknesses of the upper protective layer 18 and the lower protective layer 20 are basically the same as each other, but may be different from each other.

Here, in a case where the rigidity of the protective layer is extremely high, not only is the stretch and contraction of the piezoelectric layer 12 constrained, but also the flexibility is impaired. Therefore, it is advantageous that the thickness of the protective layer decrease except for the case where the mechanical strength or excellent handleability as a sheet-like material is required.

Based on the examination conducted by the present inventors, in a case where the thickness of the upper protective layer 18 and the thickness of the lower protective layer 20 are respectively two times or less the thickness of the piezoelectric layer 12, preferable results in terms of achieving both ensuring of the rigidity and moderate elasticity can be obtained.

For example, in a case where the thickness of the piezoelectric layer 12 is 50 µm and the lower protective layer 20 and the upper protective layer 18 consist of PET, the thickness of the lower protective layer 20 and the thickness of the upper protective layer 18 are respectively preferably 100 µm or less, more preferably 50 µm or less, and still more preferably 25 µm or less.

In the piezoelectric film 10, the upper thin film electrode 14 is formed between the piezoelectric layer 12 and the upper protective layer 18, and the lower thin film electrode 16 is formed between the piezoelectric layer 12 and the lower protective layer 20. In the description below, the upper thin film electrode 14 is also referred to as an upper electrode 14, and the lower thin film electrode 16 is also referred to as a lower electrode 16.

The upper electrode 14 and the lower electrode 16 are provided to apply an electric field to the piezoelectric film 10 (piezoelectric layer 12).

Further, the lower electrode 16 and the upper electrode 14 are basically the same as each other. Therefore, in the description below, in a case where it is not necessary to distinguish the lower electrode 16 from the upper electrode 14, both members are collectively referred to as a thin film electrode.

In the piezoelectric film according to the embodiment of the present invention, the material for forming the thin film electrode is not limited, and various conductors can be used as the material. Specific examples thereof include conductive polymers such as carbon, palladium, iron, tin, aluminum, nickel, platinum, gold, silver, copper, chromium, molybdenum, alloys thereof, indium tin oxide, and polyethylene dioxythiophene-polystyrene sulfonic acid (PEDOT/PPS).

Among these, copper, aluminum, gold, silver, platinum, and indium tin oxide are suitable. Among these, from the viewpoints of the conductivity, the cost, and the flexibility, copper is more preferable.

In addition, the method of forming the thin film electrode is not limited, and various known methods, for example, a vapor-phase deposition method (a vacuum film forming method) such as vacuum vapor deposition or sputtering, a film forming method using plating, a method of bonding a foil formed of the materials described above, and a coating method can be used.

Among these, particularly from the viewpoint of ensuring the flexibility of the piezoelectric film 10, a thin film made of copper, aluminum, or the like formed by vacuum vapor deposition is suitably used as the thin film electrode. Among these, particularly a thin film made of copper formed by vacuum vapor deposition is suitably used.

The thickness of the upper electrode 14 and the lower electrode 16 is not limited. In addition, the thicknesses of the upper electrode 14 and the lower electrode 16 may be basically the same as or different from each other.

Here, similarly to the protective layer described above, in a case where the rigidity of the thin film electrode is extremely high, not only is the stretch and contraction of the piezoelectric layer 12 constrained, but also the flexibility is impaired. Therefore, it is advantageous that the thicknesses of the thin film electrode decreases in a case where the electrical resistance is not excessively high.

It is suitable that the product of the thicknesses of the thin film electrode of the piezoelectric film 10 according to the embodiment of the present invention and the Young's modulus thereof is less than the product of the thickness of the protective layer and the Young's modulus thereof because the flexibility is not considerably impaired.

For example, in a case of a combination consisting of the protective layer formed of PET (Young's modulus: approximately 6.2 GPa) and the thin film electrode formed of copper (Young's modulus: approximately 130 GPa), the thickness of the thin film electrode is preferably 1.2 µm or less, more preferably 0.3 µm or less, and still more preferably 0.1 µm or less in a case of assuming that the thickness of the protective layer is 25 µm.

As described above, the piezoelectric film 10 has a configuration in which the piezoelectric layer 12 containing the piezoelectric particles 26 in the polymer matrix 24 containing the polymer material is sandwiched between the upper electrode 14 and the lower electrode 16 and the laminate is further sandwiched between the upper protective layer 18 and the lower protective layer 20.

It is preferable that, in such a piezoelectric film 10, the maximal value at which the loss tangent (tan δ) at a frequency of 1 Hz according to dynamic viscoelasticity measurement is 0.1 or greater is present at room temperature.

In this manner, even in a case where the piezoelectric film 10 is subjected to bending deformation at a slow vibration of less than or equal to a few Hz from the outside, since the strain energy can be effectively diffused to the outside as heat, occurrence of cracks on the interface between the polymer matrix and the piezoelectric particles can be prevented.

In the piezoelectric film 10, it is preferable that the storage elastic modulus (E') at a frequency of 1 Hz according to the dynamic viscoelasticity measurement is 10 to 30 GPa at 0° C. and 1 to 10 GPa at 50° C.

In this manner, the piezoelectric film 10 may have large frequency dispersion in the storage elastic modulus (E') at room temperature. That is, the piezoelectric film 10 can exhibit a behavior of being rigid with respect to a vibration of 20 Hz to 20 kHz and being flexible with respect to a vibration of less than or equal to a few Hz.

In the piezoelectric film 10, it is preferable that the product of the thickness and the storage elastic modulus (E') at a frequency of 1 Hz according to the dynamic viscoelasticity measurement is in a range of $1.0 \times 10^6$ to $2.0 \times 10^6$ N/m at 0° C. and in a range of $1.0 \times 10^5$ to $1.0 \times 10^6$ N/m at 50° C.

In this manner, the piezoelectric film 10 may have moderate rigidity and mechanical strength within a range not impairing the flexibility and the acoustic characteristics.

Further, in the piezoelectric film 10, it is preferable that the loss tangent (Tan δ) at a frequency of 1 kHz at 25° C. is 0.05 or greater in a master curve obtained from the dynamic viscoelasticity measurement.

In this manner, the frequency of a speaker using the piezoelectric film 10 is smooth as the frequency characteristic thereof, and thus a change in acoustic quality in a case where the lowest resonance frequency $f_0$ is changed according to a change in the curvature of the speaker (piezoelectric film 10) can be decreased.

As described above, in the piezoelectric film 10 according to the embodiment of the present invention, in a case where piezoelectric layer 12 is divided into two equal regions in the thickness direction in the cross section observed by a SEM, and the void volumes of the two equal regions are measured, the ratio of the void volume obtained by dividing the void volume of the region with a larger void volume by the void volume of the region with a smaller void volume is 1.2 or greater.

Specifically, as an example, a SEM image of a cross section of the piezoelectric film 10 cut at an arbitrary position in the thickness direction is obtained. In the cross-sectional SEM image, the piezoelectric layer 12 is divided into two equal regions in the thickness direction as indicated by the dashed line in FIG. 1 such that the interface between the upper electrode 14 and the piezoelectric layer 12 and the interface between the lower electrode and the piezoelectric layer 12 are respectively the upper surface and the lower surface of the piezoelectric layer 12 in the thickness direction.

In the following description, for convenience, the upper electrode 14 side of the piezoelectric layer 12 divided into two equal regions in the thickness direction is defined as an upper region 12U and the lower electrode 16 side is defined as a lower region 12L.

The void volume for each of the upper region 12U and the lower region 12L set in the above-described manner is measured. The void volume is the total area ratio of the voids 28 in each region in the cross-sectional SEM image. For example, in a case of the void volume of the upper region 12U, the void volume in the upper region 12U may be calculated by acquiring the total area of the voids 28 obtained by image-analyzing the cross-sectional SEM image and summing the area of the upper region 12U and the area of all the voids 28 in the upper region 12U.

In general, in the cross-sectional image (monochrome image) of the piezoelectric film 10, the density (brightness) of the image satisfies the relationship of "piezoelectric particles and thin film electrodes>polymer matrix (binder) and protective layer>voids".

Therefore, for example, in the cross-sectional SEM image of the piezoelectric film 10, the piezoelectric layer 12 is divided into two equal regions in the thickness direction as described above to set the upper region 12U and the lower region 12L. Thereafter, the cross-sectional SEM image is binarized into black (high density) and white (low density) using an appropriately selected density as a threshold value. The void volume in each region may be acquired by analyzing the binarized image and acquiring the total area of the voids 28 in each region of the area of the upper region 12U and the area of the lower region 12L.

In the present invention, as an example, the void volume of the upper region 12U and the lower region 12L is measured with ten cross sections arbitrarily set in the piezoelectric film 10.

The average value of the void volumes of the upper region 12U and the lower region 12L in the ten cross sections is defined as the void volume of the upper region 12U and the lower region 12L in the piezoelectric film 10. That is, in the present invention, as an example, the average value of the void volumes in the ten cross sections is defined as the void volume of each region of the piezoelectric layer 12 divided into two equal regions in the thickness direction in the piezoelectric film 10.

In the piezoelectric film 10 according to the embodiment of the present invention, in the void volumes of the upper region 12U and the lower region 12L measured in the above-described manner, the ratio of the void volume obtained by dividing the void volume of the region with a larger void volume by the void volume of the region with a smaller void volume is 1.2 or greater.

For example, in a case where the void volume of the upper region 12U is larger than the void volume of the lower region 12L, the ratio of the void volume obtained by dividing the void volume of the upper region 12U by the void volume of the lower region 12L is 1.2 or greater. That is, in this case, a relationship of "ratio of void volume=[void volume of upper region 12U]/[void volume of lower region 12L]≥1.2" is satisfied.

That is, in the piezoelectric film 10 according to the embodiment of the present invention, in the void volumes of the upper region 12U and the lower region 12L measured in the above-described manner, the void volume of the region with a larger void volume is 1.2 or greater in a case where the void volume of the region with a smaller void volume is standardized as 1.

With such a configuration, the piezoelectric film 10 according to the embodiment of the present invention has high durability to prevent damage to the piezoelectric layer 12 due to warpage and has a characteristic of obtaining a sufficient sound pressure with respect to the input operating voltage.

As described above, by maintaining the piezoelectric film in a bent state and applying a driving voltage to the electrode layer, the piezoelectric film stretches and contracts in the plane direction and allows to vibrate in a direction orthogonal to the surface due to the stretch and contraction, and thus a sound is output in a case where the piezoelectric film is used for a piezoelectric speaker as an electroacoustic conversion film.

The piezoelectric film is greatly warped by the vibration of the piezoelectric film. In a case where the piezoelectric film is in a warped state, a region where the degree of a volume change varies in the thickness direction is present in the piezoelectric layer constituting the piezoelectric film. Due to such a difference in volume change in the thickness direction, a large stress is imparted to the piezoelectric layer, and defects such as cracking and peeling of the piezoelectric film from the electrode layer occur.

Therefore, as the piezoelectric film of the related art is used, deterioration of acoustic characteristics such as a decrease in sound pressure occurs.

On the contrary, in the piezoelectric film 10 according to the embodiment of the present invention, in the void volumes of the upper region 12U and the lower region 12L divided into two equal regions in the thickness direction, the ratio of the void volume obtained by dividing the void volume of the region with a larger void volume by the void volume of the region with a smaller void volume is 1.2 or greater. That is, in a case where the piezoelectric layer 12 is divided into two equal regions in the thickness direction, the piezoelectric layer 12 has a region with a relatively large number of voids and a region with a relatively small number of voids in the thickness direction.

In a case where such a piezoelectric film 10 according to the embodiment of the present invention is in a warped state, the voids 28 that are present in the region with a large number of voids 28 absorb the volume change of the piezoelectric layer 12 in the thickness direction due to the warpage.

As a result, the piezoelectric film 10 according to the embodiment of the present invention reduces the stress applied to the piezoelectric layer 12 due to the warpage of the piezoelectric film 10 and presents occurrence of cracks in the piezoelectric layer 12 and occurrence of defects such as peeling of the piezoelectric layer 12 from the thin film electrode for a long period of time. Therefore, the piezoelectric film 10 according to the embodiment of the present invention has satisfactory durability to suppress deterioration of acoustic characteristics such as a decrease in sound pressure associated with the usage of the film.

Here, from the viewpoint of the durability, it is preferable that the void volume is uniformly high in the entire piezoelectric film. However, in a case where the void volume is uniformly high throughout the piezoelectric film, sufficient acoustic characteristics cannot be obtained due to a low sound pressure with respect to the input operating voltage.

On the contrary, in the two regions equally divided in the thickness direction, that is, the upper region 12U and the lower region 12L in the piezoelectric film 10 according to the embodiment of the present invention, one region has a void volume of 1.2 times or greater the void volume of the other region. That is, the piezoelectric film 10 according to the embodiment of the present invention has a region where the void volume is relatively low as compared with the other region in the two regions equally divided in the thickness direction.

Therefore, in the piezoelectric film 10 according to the embodiment of the present invention, since the region with a lower void volume can ensure the acoustic characteristics, the piezoelectric film 10 has high durability due to the region having a high void volume and an acoustic characteristic of obtaining a sufficient sound pressure with respect to the input operating voltage.

That is, according to the present invention, a piezoelectric film 10 achieving both satisfactory durability and acoustic characteristics, in which a sufficient sound pressure with respect to the input operating voltage is obtained, the acoustic characteristics such as a decrease in sound pressure associated with the usage of the film do not deteriorate, and the durability to maintain the initial performance for a long period of time is satisfactory, can be realized.

In the piezoelectric film 10 according to the embodiment of the present invention, the ratio of the void volume obtained by dividing the void volume of the region with a larger void volume by the void volume of the region with a smaller void volume in the upper region 12U and the lower region 12L is 1.2 or greater. In the following description, the "ratio of the void volume obtained by dividing the void volume of the region with a larger void volume by the void volume of the region with a smaller void volume" will also be simply referred to as the "ratio of the void volume".

In a case where the ratio of the void volume is less than 1.2, an inconvenience, for example, deterioration of acoustic characteristics such as a decrease in sound pressure associated with the usage of the film occurs.

The ratio of the void volume is preferably 2 or greater and more preferably 5 or greater.

In the piezoelectric film 10 according to the embodiment of the present invention, it is preferable that the ratio of the void volume is basically large from the viewpoint of preventing deterioration of acoustic characteristics. However, in a case where the ratio of the void volume is extremely large, the void volume of one region is extremely large, and thus this region may not contribute to the acoustic characteristics.

From this viewpoint, the ratio of the void volume is preferably 65 or less and more preferably 50 or less.

Further, in the piezoelectric film 10 according to the embodiment of the present invention, the performance of the piezoelectric film 10 is not affected even in a case where any region of the upper region 12U and the lower region 12L has a larger void volume than that of the other region. Further, as described above, the terms "upper" and "lower" in the piezoelectric film 10 according to the embodiment of the present invention have no technical meaning and are irrelevant to the actual use state.

Therefore, in the piezoelectric film 10 according to the embodiment of the present invention, the region with a larger void volume may be any of the upper region 12U or the lower region 12L.

In the piezoelectric film 10 according to the embodiment of the present invention, the void volumes of the upper region 12U and the lower region 12L are not limited. Basically, the acoustic characteristics of the piezoelectric film 10 according to the embodiment of the present invention are improved as the void volume decreases.

In the piezoelectric film 10 according to the embodiment of the present invention, the average of the void volume of the upper region 12U and the void volume of the lower region 12L is preferably 30% or less. In the following description, the "average of the void volume of the upper region 12U and the void volume of the lower region 12L will also be referred to as the "average void volume." The average void volume is more preferably 20% or less and still more preferably 5% or less.

FIGS. 2 to 5 conceptually illustrate an example of the method of producing the piezoelectric film 10.

Figure 2:
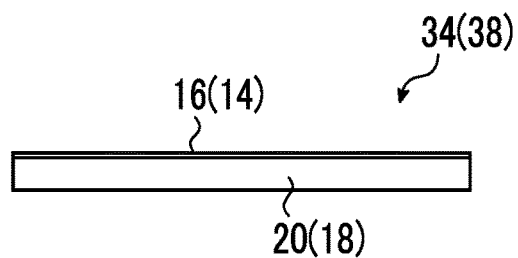
FIG. 2 is a conceptual view for describing a method of producing the piezoelectric film illustrated in FIG. 1.

First, as conceptually illustrated in FIG. 2, a sheet-like material 34 in which the lower electrode 16 is formed on the lower protective layer 20 is prepared.

The sheet-like material 34 may be prepared by forming a copper thin film or the like as the lower thin film electrode 16 on the surface of the lower protective layer 20 using vacuum vapor deposition, sputtering, plating, or the like. Similarly, the sheet-like material 38 may be prepared by forming a copper thin film or the like as the upper thin film electrode 14 on the surface of the upper protective layer 18 using vacuum vapor deposition, sputtering, plating, or the like.

Alternatively, a commercially available sheet-like material in which a copper thin film or the like is formed on a protective layer may be used as the sheet-like material 34 (a sheet-like material 38 described below).

In a case where the protective layer is extremely thin and thus the handleability is degraded, a protective layer with a separator (temporary support) may be used as necessary. Further, a PET having a thickness of 25 µm to 100 µm or the like can be used as the separator. The separator may be removed after thermal compression bonding of the thin film electrode and the protective layer.

Figure 3:
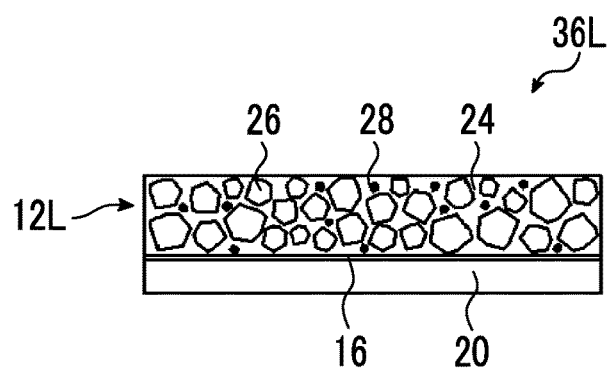
FIG. 3 is a conceptual view for describing a method of producing the piezoelectric film illustrated in FIG. 1.

Next, as conceptually illustrated in FIG. 3, a lower laminate 36L obtained by coating the lower electrode 16 of the sheet-like material 34 with the coating material (coating composition) that is the piezoelectric layer 12, curing the material to form a region that is the lower region 12L of the piezoelectric layer 12, and laminating the sheet-like material 34 and the lower region 12L is prepared. That is, in the present example, a piezoelectric layer having a thickness that is approximately one half the thickness of the piezoelectric layer 12 originally formed is formed on the lower electrode 16 of the sheet-like material 34.

Thereafter, according to the production method, the lower region 12L is subjected to a thermal compression treatment. The thickness of the lower region 12L after the thermal compression treatment varies depending on the conditions of the thermal compression treatment. Therefore, in the description of the production method, the lower region 12L is named for convenience, but the lower region 12L in the middle of the production does not necessarily coincide with the lower region 12L in the completed piezoelectric film 10. In this regard, the same applies to the upper region 12U described later.

In the formation of the lower region 12L (piezoelectric layer 12), first, the coating material is prepared by dissolving the polymer material in an organic solvent, adding the piezoelectric particles 26 such as PZT particles thereto, and stirring the solution.

The organic solvent is not limited, and various organic solvents such as dimethylformamide (DMF), methyl ethyl ketone, and cyclohexanone can be used.

In a case where the sheet-like material 34 is prepared and the coating material is prepared, the coating material is cast (applied) onto the sheet-like material 34, and the organic solvent is evaporated and dried. In this manner, as illustrated in FIG. 6, the lower laminate 36L in which the lower electrode 16 is provided on the lower protective layer 20 and the lower region 12L of the piezoelectric layer 12 is laminated on the lower electrode 16 is prepared.

A casting method of the coating material is not limited, and all known methods (coating devices) such as a bar coater, a slide coater, and a doctor knife can be used.

Figure 6:
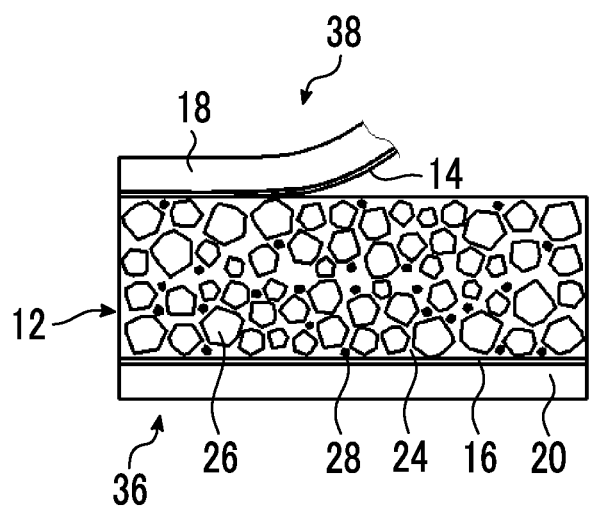
FIG. 6 is a conceptual view for describing a method of producing the piezoelectric film illustrated in FIG. 1.

Alternatively, in a case where the polymer material is a material that can be heated and melted, the laminate 36 as illustrated in FIG. 6 may be prepared by heating and melting the polymer material to prepare a melt obtained by adding the piezoelectric particles 26 to the melted material, extruding the melt on the sheet-like material 34 illustrated in FIG. 2 in a sheet shape by carrying out extrusion molding or the like, and cooling the laminate.

As described above, in the piezoelectric film 10, a polymer piezoelectric material such as PVDF may be added to the polymer matrix 24 in addition to the polymer material having a viscoelasticity at room temperature.

In a case where the polymer piezoelectric material is added to the polymer matrix 24, the polymer piezoelectric material to be added to the coating material may be dissolved. Alternatively, the polymer piezoelectric material may be added to the heated and melted polymer material having a viscoelasticity at room temperature so that the polymer piezoelectric material is heated and melted.

After the lower region 12L of the piezoelectric layer 12 is formed, a thermal compression treatment of compressing the lower region 12L while heating and pressurizing the lower region 12L is performed.

During the thermal compression treatment, the void volume of the lower region 12L can be adjusted by adjusting at least one of the pressure applied to the lower region 12L, the temperature, or the treatment speed (treatment time). In general, the void volume of the lower region 12L decreases as the pressure of the thermal compression treatment increases. Further, the void volume of the lower region 12L decreases as the temperature of the thermal compression treatment increases. Further, the void volume of the lower region 12L decreases as the treatment speed decreases (the treatment time increases).

The method of the thermal compression treatment is not limited, and various known methods used for thermal compression of a resin layer or the like can be used.

Examples thereof include a press treatment of thermally compressing the lower region 12L with a heated pressure plate (press plate) and a calender treatment of thermally compressing the lower region 12L with a heating roller.

Figure 4:
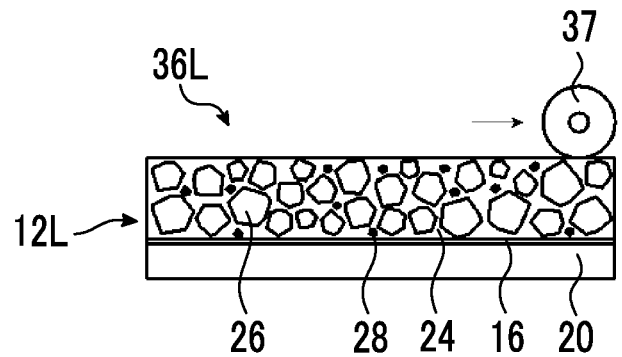
FIG. 4 is a conceptual view for describing a method of producing the piezoelectric film illustrated in FIG. 1.

In the present example, as conceptually illustrated in FIG. 4, the calender treatment is performed by the heating roller 37 from a side opposite to the lower electrode 16 as the thermal compression treatment of the lower region 12L.

The thermal compression treatment may be performed once or a plurality of times.

Further, the conditions such as the temperature and the pressure of the thermal compression treatment may be appropriately determined according to the material and the state of the polymer matrix 24 of the piezoelectric layer 12, the amount of the piezoelectric particles 26 added to the coating material, the target void volume, and the like.

It is preferable that the thermal compression treatment is performed before the polarization treatment of the lower region 12L described below.

In a case where the thermal compression treatment is performed, a large amount of the piezoelectric particles 26 are pushed into the lower region 12L. In this case, the piezoelectric particles 26 to be pushed into the region along with rotation are also present. Therefore, in a case where the thermal compression treatment is performed after the polarization treatment, the piezoelectric particles 26 whose polarization direction is inclined from the original film thickness direction are generated, and the piezoelectric characteristics of the piezoelectric film 10 are deteriorated. Further, such an inconvenience also occurs in a case of the thermal compression bonding of the laminate according to the thermal compression bonding described below.

On the contrary, by performing the polarization treatment after the calender treatment, deterioration of the piezoelectric characteristics due to the rotation of the piezoelectric particles 26 can be prevented. Further, since the calender treatment is performed once, the piezoelectric particles 26 are unlikely to rotate even in a case of the thermal compression bonding of the laminate according to the thermal compression bonding described below.

Next, the lower region 12L of the lower laminate 36L, in which the thermal compression treatment has been performed on the lower region 12L, is subjected to the polarization treatment (poling). The polarization treatment of the lower region 12L may be performed before the thermal compression treatment, but it is preferable that the polarization treatment is performed after the thermal compression treatment as described above.

The method of performing the polarization treatment on the lower region 12L is not limited, and a known method can be used. For example, electric field poling in which a DC electric field is directly applied to a target to be subjected to the polarization treatment is exemplified. Further, in a case where the polarization treatment is performed by electric field poling, the upper region 12U and the lower region 12L are not subjected to the polarization treatment separately, but the upper region 12U and the upper electrode 14 are laminated as described later before the polarization treatment, and the electric field poling treatment may be performed using the upper electrode 14 and the lower electrode 16.

Further, in a case where the piezoelectric film 10 according to the embodiment of the present invention is produced, the polarization treatment is performed in the thickness direction of the piezoelectric layer 12 (polymer-based piezoelectric composite material) instead of the plane direction.

Meanwhile, the sheet-like material 38 having the upper electrode 14 formed on the surface of the upper protective layer 18, similar to the sheet-like material 34 described above, is prepared (see FIG. 2).

The upper region 12U of the piezoelectric layer 12 is formed on the sheet-like material 38 in the same manner as the lower region 12L of the lower laminate 36L to prepare the upper laminate 36U, the thermal compression treatment is performed on the upper region 12U of the upper laminate 36U, and the polarization treatment is performed in the thickness direction.

In this case, by setting at least one of the pressure, the temperature, or the treatment speed (treatment time) of the thermal compression treatment of the upper region 12U to be different from that of the lower region 12L, the upper region 12U whose void volume is different from that of the lower region 12L can be prepared. As described above, the void volume may be higher in any of the lower region 12L or the upper region 12U.

Further, in the polarization treatment of the upper region 12U, the polarization direction is reversed from that of the lower region 12L. For example, in a case where the electric field poling is performed and a negative electrode of a DC power source is connected to the lower electrode 16 side in the polarization treatment of the lower region 12L, the polarization treatment is performed by connecting a positive electrode of a DC power source 32 to the upper electrode 14 side in the polarization treatment of the upper region 12U.

Figure 5:
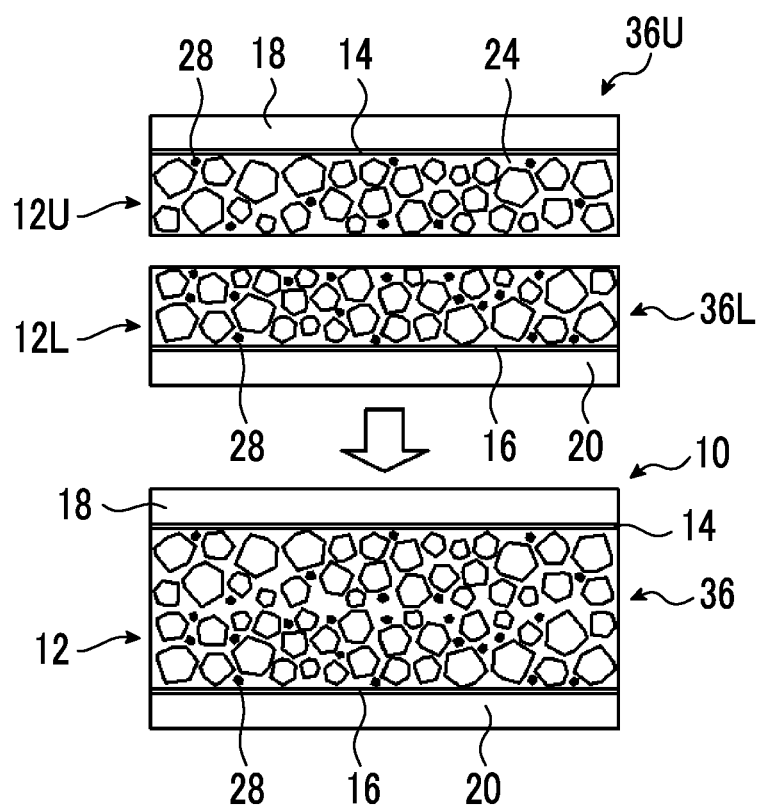
FIG. 5 is a conceptual view for describing a method of producing the piezoelectric film illustrated in FIG. 1.

In this manner, in a case where the lower laminate 36L in which the lower region 12L is subjected to the polarization treatment and the upper laminate 36U in which the upper region 12U is subjected to the polarization treatment are prepared, the lower laminate 36L and the upper laminate 36U are laminated by allowing the lower region 12L and the upper region 12U to face each other as illustrated in FIG. 5.

Next, the piezoelectric film 10 according to the embodiment of the present invention as illustrate in FIG. 1 is prepared by performing thermal compression bonding on the laminate using a heating press device, heating rollers, or the like such that the laminate is sandwiched between the lower protective layer 20 and the upper protective layer 18 and bonding the lower region 12L and the upper region 12U to each other.

In the example described above, the lower region 12L of the piezoelectric layer 12 is formed on the sheet-like material 34, the upper region 12U of the piezoelectric layer 12 is formed on the sheet-like material 38, and the regions are laminated. That is, in the present example, the piezoelectric film 10 according to the embodiment of the present invention is prepared by forming a piezoelectric layer having a thickness that is one half the thickness of the piezoelectric layer to be finally obtained on two sheet-like materials to be laminated.

However, the piezoelectric film 10 according to the embodiment of the present invention is not limited to being produced by this method and can be produced by forming piezoelectric layers having thicknesses with various ratios on two sheet-like materials and laminating the layers. For example, the piezoelectric film 10 may be prepared by forming two-thirds of the piezoelectric layer 12 on the sheet-like material 34 on the lower electrode 16 side, forming one-third of the piezoelectric layer 12 on the sheet-like material 38 on the upper electrode 14 side, and laminating and thermally compression bonding the layers. Even in this production method, the piezoelectric film 10 according to the embodiment of the present invention in which the ratio of the void volume in two regions is 1.2 or greater in a case the piezoelectric layer is divided into two equal regions in the thickness direction can be suitably produced.

Further, the piezoelectric film 10 according to the embodiment of the present invention is not limited to being prepared by laminating two piezoelectric layers having different void volumes in the above-described manner.

That is, the piezoelectric layer 12 having a thickness corresponding to the final thickness is formed on the sheet-like material 34 having the lower electrode 16 in the same manner as in the above-described example, the thermal compression treatment is performed, and the polarization treatment is performed. Next, as conceptually illustrated in FIG. 6, the piezoelectric film 10 according to the embodiment of the present invention may be produced by laminating the sheet-like material 38 having the upper electrode 14 and the upper protective layer 18 and thermally compression bonding the laminate.

Here, according to this production method, the void volume of the piezoelectric layer is substantially uniform over the entire region in the thickness direction in a case where the thermal compression treatment is performed under typical conditions. Therefore, in a case where the thermal compression treatment is performed under typical conditions, the piezoelectric film 10 according to the embodiment of the present invention in which the ratio of the void volume in two regions is 1.2 or greater in a case where the piezoelectric layer is divided into two equal regions in the thickness direction is extremely difficult to produce.

On the contrary, in a case where the piezoelectric film 10 according to the embodiment of the present invention is prepared, the thermal compression treatment is performed a plurality of times by setting the condition of the thermal compression treatment to at least one of decreasing the pressure, decreasing the temperature, or increasing the treatment speed (decreasing the treatment time) as compared with the original thermal compression treatment to be performed.

In this manner, the compression efficiency on the surface side to be pressed in the thermal compression treatment can be increased, and the void volume on the surface side to be subjected to the thermal compression treatment can be set to be lower than the void volume on the opposite side in the piezoelectric layer. As a result, the piezoelectric film 10 according to the embodiment of the present invention in which the ratio of the void volume in two regions is 1.2 or greater in a case where the piezoelectric layer is divided into two equal regions can be suitably produced.

The number of times of performing the thermal compression treatment here and the pressure and/or the temperature of the thermal compression treatment may be appropriately set according to the material and the state of the polymer matrix 24 of the piezoelectric layer 12, the amount of the piezoelectric particles 26 added to the coating material, the target average void volume, and the target ratio of the void volume.

The piezoelectric film 10 according to the embodiment of the present invention to be prepared in the above-described manner is polarized in the thickness direction instead of the plane direction, and thus excellent piezoelectric characteristics are obtained even in a case where the stretching treatment is not performed after the polarization treatment. Therefore, the piezoelectric film 10 according to the embodiment of the present invention has no in-plane anisotropy as a piezoelectric characteristic, and stretches and contracts isotropically in all directions in the in-plane direction in a case where a driving voltage is applied.

The piezoelectric film 10 according to the embodiment of the present invention may be produced using the cut sheet-like material 34 and preferably using roll-to-roll (Roll to Roll). In the following description, roll-to-roll is also referred to as "RtoR".

As is well known, RtoR is a production method of pulling out a long raw material from a roll around which the raw material is wound, performing various treatments such as film formation and a surface treatment while transporting the raw material in the longitudinal direction, and winding the treated raw material into a roll shape again.

In a case where the piezoelectric film 10 is produced using the above-described production method by RtoR, a first roll obtained by winding the long sheet-like material 34 and a second roll obtained by winding the long sheet-like material 38 are used.

The first roll and the second roll may be exactly the same as each other.

The lower laminate 36 obtained by laminating the sheet-like material 34 and the lower region 12L is prepared by pulling out the sheet-like material 34 from the first roll, coating the lower electrode 16 of the sheet-like material 34 with the coating material containing the polymer material and the piezoelectric particles 26 while the laminate is transported in the longitudinal direction, and drying the coating material by performing heating or the like to form the lower region 12L of the piezoelectric layer 12 on the lower electrode 16.

Next, the calender treatment is performed on the lower region 12L while the lower laminate 36 is transported in the longitudinal direction.

Next, the lower region 12L is subjected to the polarization treatment. Here, in a case where the piezoelectric film 10 is produced by RtoR, the polarization treatment is performed on the lower region 12L by a rod-like electrode disposed in a state of extending in a direction orthogonal to the transport direction of the lower laminate 36 while the lower laminate 36 is transported.

Meanwhile, the sheet-like material 38 is pulled out from the second roll formed by winding the long sheet-like material 38, the upper region 12U of the piezoelectric layer 12 is formed to prepare the upper laminate 36 U similar to the lower region 12L while the sheet-like material 38 is transported, and the calender treatment and the polarization treatment are performed on the upper laminate 36U and the upper region 12U.

In this case, in order to make the void volume of the upper region 12U different from the void volume of the lower region 12L, the conditions for the pressure and/or the temperature of the calender treatment are set to be different from the conditions for the lower laminate 36L as described above. Further, as described above, the polarization direction in the polarization treatment is set to the direction opposite to that of the lower laminate 36L.

Thereafter, the lower laminate 36L and the upper laminate 36U that have been subjected to the polarization treatment are transported in the longitudinal direction in a state where the lower region 12L and the upper region 12U face each other, and both are laminated. Thereafter, the laminate of the lower laminate 36L and the upper laminate 36U is subjected to thermal compression bonding by being sandwiched and transported by a pair of heating rollers to complete the piezoelectric film 10 according to the embodiment of the present invention, and the piezoelectric film 10 is wound in a roll shape.

In the above-described example, the piezoelectric film 10 according to the embodiment of the present invention is prepared by transporting the sheet-like material (laminate) only once in the longitudinal direction by RtoR, but the present invention is not limited thereto. That is, in a case where any one or more steps are completed, a long sheet-like material may be wound in a roll shape, and the next step may be performed by pulling out the sheet-like material from the roll.

For example, the lower laminate 36L that has been subjected to the polarization treatment of the lower region 12L is once wound in a roll shape. Further, the upper laminate 36U that has been subjected to the polarization treatment of the upper region 12U is also once wound into a roll shape. Thereafter, the lower laminate 36L is pulled out from one roll, the upper laminate 36U is pulled out from the other roll, and the lower laminate 36L and the upper laminate 36U are laminated and subjected to thermal compression bonding while being transported in the longitudinal direction in a state where the lower region 12L and the upper region 12U face each other in the same manner as described above. In this manner, the piezoelectric film 10 according to the embodiment of the present invention is completed and may be rolled in a roll shape.

Further, as described above, the piezoelectric film according to the embodiment of the present invention can also be produced by performing the thermal compression treatment a plurality of times on one piezoelectric layer under conditions of a lower pressure and/or a lower temperature than usual.

According to this production method, for example, the thermal compression treatment may be performed a plurality of times on one piezoelectric layer by disposing a plurality of heating rollers or the like on the sheet-like material in the transport direction.

Figure 7:
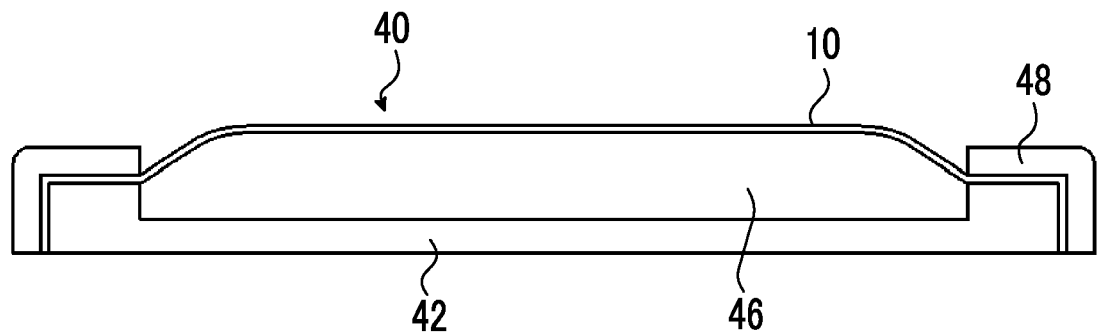
FIG. 7 conceptually illustrates an example of a piezoelectric speaker formed of the piezoelectric film illustrated in FIG. 1.

FIG. 7 is a conceptual view illustrating an example of a flat plate type piezoelectric speaker including the piezoelectric film 10 according to the embodiment of the present invention.

The piezoelectric speaker 40 is a flat plate type piezoelectric speaker that uses the piezoelectric film 10 according to the embodiment of the present invention as a vibration plate that converts an electrical signal into vibration energy. Further, the piezoelectric speaker 40 can also be used as a microphone, a sensor, or the like.

The piezoelectric speaker 40 is configured to have the piezoelectric film 10, a case 42, a viscoelastic support 46, and a frame 48.

The case 42 is a thin housing formed of plastic or the like and having one surface that is open. Examples of the shape of the housing include a rectangular parallelepiped shape, a cubic shape, and a cylindrical shape.

Further, the frame 48 is a frame material that has, in the center thereof, a through hole having the same shape as the open surface of the case 42 and engages with the open surface side of the case 42.

The viscoelastic support 46 is a support used for efficiently converting the stretch and contraction movement of the piezoelectric film 10 into a forward and rearward movement (a movement in the direction perpendicular to the surface of the film) by means of having moderate viscosity and elasticity, supporting the piezoelectric film 10, and applying a constant mechanical bias to any place of the piezoelectric film. Examples of the viscoelastic support 46 include wool felt, nonwoven fabric such as wool felt containing PET, and glass wool.

The piezoelectric speaker 40 is configured by accommodating the viscoelastic support 46 in the case 42, covering the case 42 and the viscoelastic support 46 with the piezoelectric film 10, and fixing the frame 48 to the case 42 in a state of pressing the periphery of the piezoelectric film 10 against the upper end surface of the case 42 by the frame 48.

Here, in the piezoelectric speaker 40, the viscoelastic support 46 has a shape in which the height (thickness) is larger than the height of the inner surface of the case 42.

Therefore, in the piezoelectric speaker 40, the viscoelastic support 46 is held in a state of being thinned by being pressed downward by the piezoelectric film 10 at the peripheral portion of the viscoelastic support 46. Similarly, in the peripheral portion of the viscoelastic support 46, the curvature of the piezoelectric film 10 suddenly fluctuates, and a rising portion that decreases in height toward the periphery of the viscoelastic support 46 is formed in the piezoelectric film 10. Further, the central region of the piezoelectric film 10 is pressed by the viscoelastic support 46 having a square columnar shape and has a (approximately) planar shape.

In the piezoelectric speaker 40, in a case where the piezoelectric film 10 is stretched in the in-plane direction due to the application of a driving voltage to the lower electrode 16 and the upper electrode 14, the rising portion of the piezoelectric film 10 changes the angle in a rising direction due to the action of the viscoelastic support 46 in order to absorb the stretched part. As a result, the piezoelectric film 10 having the planar portion moves upward.

On the contrary, in a case where the piezoelectric film 10 contracts in the in-plane direction due to the application of the driving voltage to the lower electrode 16 and the upper electrode 14, the rising portion of the piezoelectric film 10 changes the angle in a falling direction (a direction approaching the flat surface) in order to absorb the contracted part. As a result, the piezoelectric film 10 having the planar portion moves downward.

The piezoelectric speaker 40 generates a sound by the vibration of the piezoelectric film 10.

In the piezoelectric film 10 according to the embodiment of the present invention, the conversion from the stretching and contracting movement to vibration can also be achieved by holding the piezoelectric film 10 in a curved state.

Therefore, the piezoelectric film 10 according to the embodiment of the present invention can function as a piezoelectric speaker having flexibility by being simply maintained in a curved state instead of the piezoelectric speaker 40 having rigidity in a flat plate shape, as illustrated in FIG. 7.

The piezoelectric speaker formed of the piezoelectric film 10 according to the embodiment of the present invention can be stored in a bag or the like by, for example, being rolled or folded using the excellent flexibility. Therefore, with the piezoelectric film 10 according to the embodiment of the present invention, a piezoelectric speaker that can be easily carried even in a case where the piezoelectric speaker has a certain size can be realized.

Further, as described above, the piezoelectric film 10 according to the embodiment of the present invention has excellent elasticity and excellent flexibility, and has no in-plane anisotropy as a piezoelectric characteristic. Therefore, in the piezoelectric film 10 according to the embodiment of the present invention, a change in acoustic quality regardless of the direction in which the film is bent is small, and a change in acoustic quality with respect to the change in curvature is also small. Accordingly, the piezoelectric speaker formed of the piezoelectric film 10 according to the embodiment of the present invention has a high degree of freedom of the installation place and can be attached to various products as described above. For example, a so-called wearable speaker can be realized by attaching the piezoelectric film 10 according to the embodiment of the present invention to clothing such as a suit and portable items such as a bag in a curved state.

Further, as described above, the piezoelectric film according to the embodiment of the present invention can be used for a speaker of a display device by bonding the piezoelectric film to a display device having flexibility such as an organic EL display device having flexibility or a liquid crystal display device having flexibility.

As described above, the piezoelectric film 10 according to the embodiment of the present invention stretches and contracts in the plane direction in a case where a voltage is applied, and vibrates suitably in the thickness direction due to the stretch and contraction in the plane direction, and thus a satisfactory acoustic characteristic of outputting a sound with a high sound pressure is exhibited in a case where the piezoelectric film 10 is used for a piezoelectric speaker or the like.

The piezoelectric film 10 according to the embodiment of the present invention, which exhibits excellent acoustic characteristics, that is, high stretch and contraction performance due to piezoelectricity is satisfactorily operated as a piezoelectric vibrating element that vibrates a vibration body such as a vibration plate by laminating a plurality of the piezoelectric films. Since the piezoelectric film 10 according to the embodiment of the present invention has high durability, high durability is also exhibited in a case where the piezoelectric films are laminated to form a piezoelectric vibrator.

Further, in a case of lamination of the piezoelectric films 10, each piezoelectric film may not have the upper protective layer 18 and/or the lower protective layer 20 unless there is a possibility of a short circuit. Alternatively, the piezoelectric film that does not have the upper protective layer 18 and/or the lower protective layer 20 may be laminated through an insulating layer.

As an example, a speaker in which a laminate of the piezoelectric films 10 is bonded to the vibration plate and the vibration plate is vibrated by the laminate of the piezoelectric films 10 to output a sound may be used. That is, in this case, the laminate of the piezoelectric film 10 acts as a so-called exciter that outputs a sound by vibrating the vibration plate.

By applying a driving voltage to the laminated piezoelectric films 10, each piezoelectric film 10 stretches and contracts in the plane direction, and the entire laminate of the piezoelectric film 10 stretches and contracts in the plane direction due to the stretch and contraction of each piezoelectric film 10. The vibration plate to which the laminate has been attached is bent due to the stretch and contraction of the laminate of the piezoelectric film 10 in the plane direction, and thus the vibration plate vibrates in the thickness direction. The vibration plate generates a sound using the vibration in the thickness direction. The vibration plate vibrates according to the magnitude of the driving voltage applied to the piezoelectric film 10 and generates a sound according to the driving voltage applied to the piezoelectric film 10.

Therefore, the piezoelectric film 10 itself does not output sound in this case.

Therefore, even in a case where the rigidity of each piezoelectric film 10 is low and the stretching and contracting force thereof is small, the rigidity is increased by laminating the piezoelectric films 10, and the stretching and contracting force as the entire laminate is increased. As a result, in the laminate of the piezoelectric films 10, even in a case where the vibration plate has a certain degree of rigidity, the vibration plate is sufficiently bent with a large force and the vibration plate can be sufficiently vibrated in the thickness direction, whereby the vibration plate can generate a sound.

In the laminate of the piezoelectric film 10, the number of laminated piezoelectric films 10 is not limited, and the number of sheets set such that a sufficient amount of vibration is obtained may be appropriately set according to, for example, the rigidity of the vibration plate to be vibrated.

Further, one piezoelectric film 10 according to embodiment of the present invention can also be used as a similar exciter (piezoelectric vibrating element) in a case where the piezoelectric film has a sufficient stretching and contracting force.

The vibration plate vibrated by the laminate of the piezoelectric film 10 according to the embodiment of the present invention is not limited, and various sheet-like materials (such as plate-like materials and films) can be used.

Examples thereof include a resin film consisting of polyethylene terephthalate (PET) and the like, foamed plastic consisting of foamed polystyrene and the like, a paper material such as a corrugated cardboard material, a glass plate, and wood. Further, a device such as a display device may be used as the vibration plate in a case where the device can be sufficiently bent.

It is preferable that the laminate of the piezoelectric film 10 according to the embodiment of the present invention is obtained by bonding adjacent piezoelectric films with a bonding layer (bonding agent). Further, it is preferable that the laminate of the piezoelectric film 10 and the vibration plate are also bonded to each other with a bonding layer.

The bonding layer is not limited, and various layers that can bond materials to be bonded can be used. Therefore, the bonding layer may consist of a pressure sensitive adhesive or an adhesive. It is preferable that an adhesive layer consisting of an adhesive is used from the viewpoint that a solid and hard bonding layer is obtained after the bonding.

The same applies to the laminate formed by folding back the long piezoelectric film 10 described later.

In the laminate of the piezoelectric films 10, the polarization direction of each piezoelectric film 10 to be laminated is not limited. As described above, the polarization direction of the piezoelectric film 10 according to the embodiment of the present invention is the polarization direction in the thickness direction.

Therefore, in the laminate of the piezoelectric films 10, the polarization directions may be the same for all the piezoelectric films 10, and piezoelectric films having different polarization directions may be present.

Here, in the laminate of the piezoelectric films 10, it is preferable that the piezoelectric films 10 are laminated such that the polarization directions of the adjacent piezoelectric films 10 are opposite to each other.

In the piezoelectric film 10, the polarity of the voltage to be applied to the piezoelectric layer 12 depends on the polarization direction. Therefore, even in a case where the polarization direction is directed from the upper electrode 14 toward the lower electrode 16 or from the lower electrode 16 toward the upper electrode 14, the polarity of the upper electrode 14 and the polarity of the lower electrode 16 in all the piezoelectric films 10 to be laminated are set to be the same polarity.

Therefore, by reversing the polarization directions of the adjacent piezoelectric films 10, even in a case where the thin film electrodes of the adjacent piezoelectric films 10 come into contact with each other, the thin film electrodes in contact with each other have the same polarity, and thus there is no risk of a short circuit.

The laminate of the piezoelectric film 10 may be configured such that a long piezoelectric film 10 is folded back, for example, once or more times, or preferably a plurality of times to laminate a plurality of layers of the piezoelectric films 10.

The structure in which the long piezoelectric film 10 is folded back and laminated has the following advantages.

That is, in the laminate in which a plurality of cut sheet-like piezoelectric films 10 are laminated, the upper electrode 14 and the lower electrode 16 need to be connected to a driving power source for each piezoelectric film. On the contrary, in the configuration in which the long piezoelectric film 10 is folded back and laminated, only one sheet of the long piezoelectric film 10 can form the laminate. Further, in the configuration in which the long piezoelectric film 10 is folded back and laminated, only one power source is required for applying the driving voltage, and the electrode may be pulled out from the piezoelectric film 10 at one place.

Further, in the configuration in which the long piezoelectric film 10 is folded back and laminated, the polarization directions of the adjacent piezoelectric films 10 are inevitably opposite to each other.

Hereinbefore, the piezoelectric film according to the embodiment of the present invention have been described in detail, but the present invention is not limited to the above-described examples, and various improvements or modifications may be made within a range not departing from the scope of the present invention.

EXAMPLES

Hereinafter, the present invention will be described in more detail with reference to specific examples of the present invention. Further, the present invention is not limited to the examples, and the materials, the used amounts, the proportions, the treatment contents, the treatment procedures, and the like shown in the following examples can be appropriately changed within a range not departing from the scope of the present invention.

Example 1

A piezoelectric film was prepared by the method illustrated in FIGS. 2 to 5.

First, cyanoethylated PVA (CR-V, manufactured by Shin-Etsu Chemical Co., Ltd.) was dissolved in methyl ethyl ketone (MEK) at the following compositional ratio. Thereafter, PZT particles serving as the piezoelectric particles were added to the solution at the following compositional ratio, and the solution was stirred using a propeller mixer (rotation speed of 2000 rpm), thereby preparing a coating material for forming a piezoelectric layer.

PZT Particles: 300 parts by mass
Cyanoethylated PVA: 30 parts by mass
DMF: 70 parts by mass Further, PZT particles obtained by sintering mixed powder, formed by wet-mixing powder of a Pb oxide, a Zr oxide, and a Ti oxide as the main components such that the amount of Zr and the amount of Ti respectively reached 0.52 moles and 0.48 moles with respect to 1 mole of Pb using a ball mill, at 800° C. for 5 hours and being subjected to a crushing treatment were used as the PZT particles.

A sheet-like material obtained by performing vacuum vapor deposition on a copper thin film having a thickness of 0.1 μm was prepared on a PET film having a thickness of 4 μm. That is, in the present example, the upper electrode and the lower electrode are copper-deposited thin films having a thickness of 0.1 μm, and the upper protective layer and the lower protective layer are PET films having a thickness of 4 μm.

The lower electrode (copper-deposited thin film) of the sheet-like material having the lower electrode and the lower protective layer was coated with the coating material for forming the piezoelectric layer prepared in advance using a slide coater.

Next, the material obtained by coating the sheet-like material with the coating material was heated and dried on a hot plate at 120° C. to evaporate DMF. In this manner, a lower laminate in which the lower thin film electrode made of copper was provided on the lower protective layer made of PET and the lower region of the piezoelectric layer was formed thereon was prepared. The term "lower region" in this case has the same definition as in the production method illustrated in FIGS. 2 to 5 described above, and thus the lower region during the production does not necessarily coincide with the lower region in the completed piezoelectric film. In this regard, the same applies to the upper region described later.

Next, as illustrated in FIG. 4, a calender treatment was performed on the upper surface (the surface on a side opposite to the lower electrode) of the lower region of the prepared lower laminate using a heating roller.

The calender treatment was performed by setting the temperature of the heating roller to 70° C., the pressing force of the heating roller to 0.3 MPa, and the moving speed of the heating roller to 0.6 m/min.

The lower region which had been subjected to the calender treatment was subjected to the polarization treatment in the thickness direction.

In this manner, a lower laminate in which the lower protective layer, the lower electrode, and the lower region of the piezoelectric layer were laminated and which was subjected to the thermal compression treatment and the polarization treatment of the lower region was formed.

Further, the upper region of the piezoelectric layer was similarly formed on the upper electrode (copper-deposited thin film) of the sheet-like material having the upper electrode and the upper protective layer, and the calender treatment and the polarization treatment were performed thereon, thereby forming an upper laminate in which the upper protective layer, the upper electrode, and the upper region of the piezoelectric layer were laminated and which was subjected to the thermal compression treatment and the polarization treatment of the upper region.

Further, in a case of formation of the upper laminate, the conditions for the calender treatment of the upper region were changed such that the temperature of the heating roller was set to 90° C., the pressing force of the heating roller was set to 0.5 MPa, and the moving speed of the heating roller was set to 0.1 m/min.

The lower laminate and the upper laminate on which the polarization treatment of the lower region and the upper region were laminated in a state where the lower region and the upper region faced each other.

The piezoelectric film as illustrated in FIG. 1 was prepared by performing thermal compression bonding on the laminate of the lower laminate and the upper laminate at a temperature of 120° C. and a pressing force of 0.01 MPa using a laminator device, and bonding the lower region and the upper region to each other.

The thickness of the piezoelectric layer of the prepared piezoelectric film was 96 μm.

A sample was cut out from the prepared piezoelectric film, and the void volume of the upper region and the lower region of the piezoelectric film was measured by the following method.

First, the piezoelectric film was cut in the thickness direction in order to observe the cross section of the piezoelectric film. The piezoelectric film was cut by mounting a histo knife blade (manufactured by Drukker) having a width of 8 mm on RM2265 (manufactured by Leica Biosystems) and setting the speed to a controller scale of 1 and an engagement amount of 0.25 μm to 1 μm.

The cross section thereof was observed with a SEM (for example, SU8220, manufactured by Hitachi High-Tech Corporation).

The sample was subjected to a conductive treatment by Pt vapor deposition, and the work distance was set to 8 mm.

The observation was made under conditions of a secondary-electron (SE) image (Upper) and an acceleration voltage of 0.5 kV, the sharpest image was output by focus adjustment and astigmatism adjustment, and automatic brightness adjustment (auto setting, brightness: 0, contrast: 0) was carried out in a state where the piezoelectric film covered the entire screen.

The photographing magnification was set as the magnification in which the upper electrode and the lower electrode fit on one screen and the width between the electrodes was at least half of the screen. Here, an image was captured such that two electrodes were horizontal to the lower portion of the image.

The image binarization was carried out by setting the lower limit of the threshold to 0, which was the minimum set value, and the upper limit of the threshold to the maximum value at which the protective layer was not colored using image analysis software ImageJ.

The area ratio of voids in the area of the piezoelectric film was calculated by defining the upper half area of the colored site between the upper electrode and the lower electrode as the area of voids, setting the defined area as a numerator, setting the area of the piezoelectric film, in which the width in the vertical direction (thickness direction) was defined as the half between the electrodes and the width in the lateral direction was defined as the both ends of the SEM image, as a denominator, and the void volume of the upper region was calculated.

Further, the area ratio of voids in the area of the piezoelectric film was calculated by defining the lower half area of the colored site between the upper electrode and the lower electrode as the area of voids, setting the defined area as a numerator, setting the area of the piezoelectric film, in which the width in the vertical direction was defined as the half between the electrodes and the width in the lateral direction was defined as the both ends of the SEM image, as a denominator, and the void volume of the lower region was calculated.

The void volume of the upper region and the lower region was calculated on any 10 cross sections of the prepared piezoelectric film. The average value of the void volume of the upper region and the void volume of the lower region in the ten cross sections was calculated and defined as the void volume of the upper region and the void volume of the lower region in the prepared piezoelectric film.

As a result, the void volume of the upper region was 1.2%, and the void volume of the lower region was 33.0%.

Therefore, in the present example, since the void volume was lower in the upper region, the ratio of the void volume, which was the value obtained by dividing the void volume of the lower region having a larger void volume by the void volume of the upper region having a smaller void volume, was 27.5. That is, in a case where the void volume of the upper region having a smaller void volume was set to 1, the void volume of the lower region having a larger void volume was set to 27.5.

The average void volume was 17.1%.

Examples 2 to 9, Examples 11 to 16, Examples 18 to 20, and Comparative Examples 1 to 4

Each piezoelectric film was prepared by forming the upper laminate and the lower laminate in the same manner as in Example 1 except that the coating thickness of the coating material forming the piezoelectric layer and the conditions for the calender treatment in the formation of the upper laminate and the lower laminate were changed.

The void volume of the upper region and the void volume of the lower region of the prepared piezoelectric film were measured in the same manner as in Example 1, and the ratio of the void volume and the average void volume were calculated.

Example 10

A laminate including the lower protective layer, the lower electrode, and the piezoelectric layer on which the calender treatment and the polarization treatment were performed was prepared in the same manner as that for the formation of the upper laminate in Example 1 except that the coating thickness of the coating material forming the piezoelectric layer and the conditions for the calender treatment were changed.

The calender treatment was performed 30 times by setting the temperature of the heating roller to 60° C., the pressing force of the heating roller to 0.05 MPa, and the moving speed of the heating roller to 3 m/min.

The sheet-like material including the same upper electrode and the same upper protective layer as in Example 1 was laminated on the prepared laminate such that the upper electrode and the piezoelectric layer faced to each other (see FIG. 6).

The piezoelectric film as illustrated in FIG. 1 was prepared by performing thermal compression bonding on the laminate of the laminate and the sheet-like material at a temperature of 120° C. and a pressing force of 0.01 MPa using a laminator device, and bonding the piezoelectric layer and the upper electrode 14 to each other.

The void volume of the upper region and the void volume of the lower region of the prepared piezoelectric film were measured in the same manner as in Example 1, and the ratio of the void volume and the average void volume were calculated.

Example 17

A piezoelectric film was prepared in the same manner as in Example 10 except that the coating thickness of the coating material forming the piezoelectric layer was changed, and the conditions for the calender treatment were changed such that the temperature of the heating roller was set to 80° C., the pressing force of the heating roller was set to 0.1 MPa, the moving speed of the heating roller was set to 3 m/min, and the number of times of the calender treatment was set to 3 times.

That is, in the present example, a piezoelectric film was prepared by performing the calender treatment a plurality of times on one piezoelectric layer, laminating the sheet-like material on the piezoelectric layer, and performing thermal compression bonding the laminate.

The void volume of the upper region and the void volume of the lower region of the prepared piezoelectric film were measured in the same manner as in Example 1, and the ratio of the void volume and the average void volume were calculated.

Example 21

A piezoelectric film was prepared in the same manner as in Example 10 except that the coating thickness of the coating material forming the piezoelectric layer was changed, and the conditions for the calender treatment were changed such that the temperature of the heating roller was set to 70° C., the pressing force of the heating roller was set to 0.1 MPa, the moving speed of the heating roller was set to 3 m/min, and the number of times of the calender treatment was set to 3 times.

That is, in the present example, a piezoelectric film was prepared by performing the calender treatment a plurality of times on one piezoelectric layer, laminating the sheet-like material on the piezoelectric layer, and performing thermal compression bonding the laminate.

The void volume of the upper region and the void volume of the lower region of the prepared piezoelectric film were measured in the same manner as in Example 1, and the ratio of the void volume and the average void volume were calculated.

Comparative Example 5

A piezoelectric film was prepared in the same manner as in Example 10 except that the coating thickness of the coating material forming the piezoelectric layer was changed, and the conditions for the calender treatment were changed such that the temperature of the heating roller was set to 70° C., the pressing force of the heating roller was set to 0.1 MPa, the moving speed of the heating roller was set to 0.6 m/min, and the number of times of the calender treatment was set to only once.

That is, in the present example, a piezoelectric film was prepared by performing the calender treatment a plurality of times on one piezoelectric layer, laminating the sheet-like material on the piezoelectric layer, and performing thermal compression bonding the laminate.

The void volume of the upper region and the void volume of the lower region of the prepared piezoelectric film were measured in the same manner as in Example 1, and the ratio of the void volume and the average void volume were calculated.

[Preparation of Piezoelectric Speaker and Measurement of Sound Pressure]

The piezoelectric speaker illustrated in FIG. 7 was prepared using the prepared piezoelectric film.

First, a rectangular test piece having a size of 210×300 mm (A4 size) was cut out from the prepared piezoelectric film. The cut-out piezoelectric film was placed on a 210×300 mm case in which glass wool serving as a viscoelastic support was stored in advance as illustrated in FIG. 7, and the peripheral portion was pressed by a frame to impart an appropriate tension and an appropriate curvature to the piezoelectric film, thereby preparing a piezoelectric speaker as illustrated in FIG. 7.

The depth of the case was set to 9 mm, the density of glass wool was set to 32 kg/m³, and the thickness before assembly was set to 25 mm. Further, all the piezoelectric speakers were prepared by setting the lower electrode side of the piezoelectric film as the viscoelastic support side.

Figure 8:
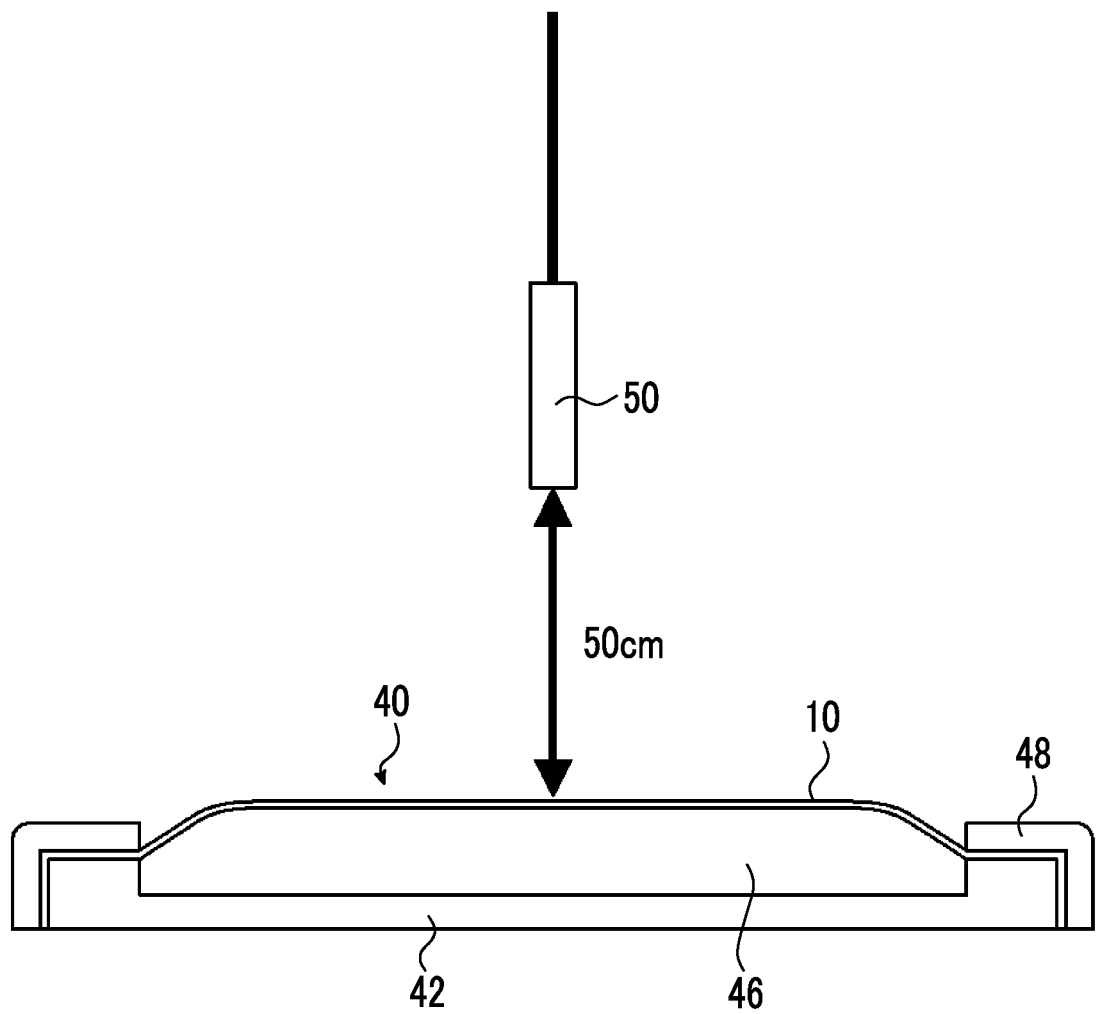
FIG. 8 is a conceptual view for describing a method of measuring a sound pressure.

A 1 kHz sine wave was input to the prepared piezoelectric speaker as an input signal through a power amplifier, and the sound pressure was measured with a microphone 50 placed at a distance of 50 cm from the center of the speaker as illustrated in FIG. 8.

The sound pressure was measured twice, 30 seconds after the start of the output from the piezoelectric speaker (initial) and 36 hours after the start of the output from the piezoelectric speaker (after the durability test). The initial sound pressure (initial), the sound pressure after the durability test (after the durability test), and the difference (deterioration) between the initial sound pressure and the sound pressure after the durability test are listed in Table 1.

identical effect regardless of the thickness of the piezoelectric layer in a case where the piezoelectric films had the identical void volume ratio.

TABLE 1

| | Piezoelectric layer | | | | | Sound pressure [dB] | | |
|---|---|---|---|---|---|---|---|---|
| | | Void volume [%] | | | Average void | | Initial | After |
| | Film thickness [um] | Upper region | Lower region | Ratio of void volume | volume [%] | Preparation method | sound pressure | durability test | Deterioration |
| Example 1 | 96 | 1.2 | 33.0 | 27..5 | 17.1 | Bonding two layers | 40.1 | 39.8 | −0.3 |
| Example 2 | 51 | 0.1 | 6.3 | 63.0 | 3.2 | Bonding two layers | 47.2 | 47.1 | −0.1 |
| Example 3 | 33 | 0.7 | 33.2 | 47.4 | 17.0 | Bonding two layers | 39.9 | 39.9 | 0.0 |
| Example 4 | 95 | 29.0 | 4.4 | 6.6 | 16.7 | Bonding two layers | 39.9 | 39.1 | −0.8 |
| Example 5 | 70 | 4.5 | 35.0 | 7.8 | 19.8 | Bonding two layers | 39.3 | 39.5 | −0.3 |
| Example 6 | 50 | 3.2 | 33.1 | 10.3 | 18.2 | Bonding two layers | 40.0 | 39.2 | −0.8 |
| Example 7 | 50 | 33.1 | 3.2 | 10.3 | 18.2 | Bonding two layers | 40.0 | 39.2 | −0.8 |
| Example 8 | 51 | 0.1 | 0.6 | 6.0 | 0.4 | Bonding two layers | 47.6 | 47.0 | −0.6 |
| Example 9 | 32 | 3.2 | 30.0 | 9.4 | 16.6 | Bonding two layers | 40.0 | 39.8 | −0.2 |
| Example 10 | 12 | 3.1 | 37.5 | 12.1 | 20.4 | Compressing one layer plurality of times | 40.2 | 39.9 | −0.3 |
| Example 11 | 97 | 36.1 | 7.0 | 5.2 | 21.6 | Bonding two layers | 38.5 | 38.0 | −0.5 |
| Example 12 | 71 | 6.8 | 33.2 | 4.9 | 20.0 | Bonding two layers | 39.2 | 38.2 | −1.0 |
| Example 13 | 49 | 10.4 | 33.1 | 3.2 | 21.8 | Bonding two layers | 40.2 | 38.4 | −1.8 |
| Example 14 | 50 | 29.8 | 6.5 | 4.6 | 18.2 | Bonding two layers | 39.5 | 38.9 | −0.6 |
| Example 15 | 49 | 0.1 | 0.9 | 9.0 | 0.5 | Bonding two layers | 48.0 | 47.3 | −0.7 |
| Example 16 | 32 | 11.3 | 27.0 | 2.4 | 19.2 | Bonding two layers | 42.3 | 39.6 | −2.7 |
| Example 17 | 13 | 6.2 | 27.3 | 4.4 | 16.8 | Compressing one layer plurality of times | 40.1 | 39.0 | −1.1 |
| Example 18 | 96 | 23.3 | 36.3 | 1.6 | 29.8 | Bonding two layers | 35.2 | 29.0 | −6.2 |
| Example 19 | 50 | 0.1 | 0.2 | 2.0 | 0.2 | Bonding two layers | 49.0 | 44.2 | −4.8 |
| Example 20 | 32 | 28.0 | 33.2 | 1.2 | 30.6 | Bonding two layers | 35.5 | 28.7 | −6.8 |
| Example 21 | 11 | 26.2 | 34.8 | 1.3 | 30.5 | Compressing one layer plurality of times | 35.0 | 26.5 | −8.5 |
| Comparative Example 1 | 96 | 30.0 | 33.2 | 1.1 | 31.6 | Bonding two layers | 31.5 | 23.0 | −10.8 |
| Comparative Example 2 | 51 | 30.1 | 32.1 | 1.1 | 31.1 | Bonding two layers | 33.0 | 23.5 | −11.3 |
| Comparative Example 3 | 51 | 0.2 | 0.2 | 1.0 | 0.2 | Bonding two layers | 49.5 | 34.0 | −14.3 |
| Comparative Example 4 | 32 | 31.2 | 33.2 | 1.1 | 32.2 | Bonding two layers | 32.1 | 21.8 | −10.3 |
| Comparative Example 5 | 10 | 31.5 | 33.0 | 1.0 | 32.3 | Compressing one layer plurality of times | 33.0 | 20.1 | −12.9 |

As listed in the table above, in the piezoelectric film according to the embodiment of the present invention, in which the piezoelectric layer was divided into two equal regions in the thickness direction and the ratio of the void volume obtained by dividing the void volume of the region with a larger void volume by the void volume of the region with a smaller void volume was 1.2 or greater, a decrease in sound pressure after the durability test with respect to the initial sound pressure was small, and the durability was excellent. Further, in Example 2, Example 8, Example 15, Example 19, and Comparative Example 3, the piezoelectric films according to the embodiment of the present invention output the same initial sound pressure as that of the piezoelectric film of the related art with an identical void volume, that is, a sufficient sound pressure with respect to the input operating voltage was obtained.

Further, as shown in Examples 6 and Example 7, the piezoelectric films according to the embodiment of the present invention were able to obtain the identical effect even in a case where whether the void volume of any of the upper region or the lower region was small. Further, as listed in Table 1, the piezoelectric films according to the embodiment of the present invention were able to obtain the Further, as shown in Example 18, Example 20, Example 21, and other examples, the decrease in sound pressure after the durability test with respect to the initial sound pressure can be reduced by setting the ratio of the void volume to 2 or greater, and the decrease in sound pressure after the durability test with respect to the initial sound pressure can be further reduced by setting the ratio of the void volume to 5 or greater. In addition, the initial sound pressure increases as the average void volume decreases, and a larger initial sound pressure is obtained by setting the average void volume to 30% or less and 20% or less.

On the contrary, in the comparative examples in which the ratio of the void volume was less than 1.2, the decrease in sound pressure after the durability test with respect to the initial sound pressure was large.

As shown in the results described above, the effects of the present invention are apparent.

EXPLANATION OF REFERENCES

10: piezoelectric film
12: piezoelectric layer
12U: upper region

12L: lower region
14: upper (thin film) electrode
16: lower (thin film) electrode
18: upper protective layer
20: lower protective layer
24: polymer matrix
26: piezoelectric particle
28: gap
34, 38: sheet-like material
36L: lower laminate
36U: upper laminate
37: heating roller
40: piezoelectric speaker
42: case
46: viscoelastic support
48: frame
50: microphone

What is claimed is:

1. A piezoelectric film comprising:
a polymer-based piezoelectric composite material which contains piezoelectric particles in a matrix containing a polymer material; and
electrode layers which are provided on both surfaces of the polymer-based piezoelectric composite material,
wherein in a case where a cross section of the piezoelectric film in a thickness direction is observed with a scanning electron microscope, the polymer-based piezoelectric composite material is divided into two equal regions in the thickness direction, and void volumes of the two regions are measured, a ratio of the void volume obtained by dividing the void volume of the region with a larger void volume by the void volume of the region with a smaller void volume is 1.2 or greater.

2. The piezoelectric film according to claim 1,
wherein an average of the void volumes of the two regions is 30% or less.

3. The piezoelectric film according to claim 2, further comprising:
a protective layer laminated on a surface of at least one electrode layer.

4. The piezoelectric film according to claim 3,
wherein the protective layers are provided on surfaces of both the electrode layers.

5. The piezoelectric film according to claim 2,
wherein the piezoelectric film is polarized in a thickness direction.

6. The piezoelectric film according to claim 2,
wherein the piezoelectric film has no in-plane anisotropy as a piezoelectric characteristic.

7. The piezoelectric film according to claim 2,
wherein the polymer material contains a cyanoethyl group.

8. The piezoelectric film according to claim 7,
wherein the polymer material is cyanoethylated polyvinyl alcohol.

9. The piezoelectric film according to claim 2,
wherein the piezoelectric particles consist of ceramic particles having a perovskite-type or wurtzite-type crystal structure.

10. The piezoelectric film according to claim 1, further comprising:
a protective layer laminated on a surface of at least one electrode layer.

11. The piezoelectric film according to claim 10,
wherein the protective layers are provided on surfaces of both the electrode layers.

12. The piezoelectric film according to claim 10,
wherein the piezoelectric film is polarized in a thickness direction.

13. The piezoelectric film according to claim 10,
wherein the piezoelectric film has no in-plane anisotropy as a piezoelectric characteristic.

14. The piezoelectric film according to claim 10,
wherein the polymer material contains a cyanoethyl group.

15. The piezoelectric film according to claim 14,
wherein the polymer material is cyanoethylated polyvinyl alcohol.

16. The piezoelectric film according to claim 1,
wherein the piezoelectric film is polarized in a thickness direction.

17. The piezoelectric film according to claim 1,
wherein the piezoelectric film has no in-plane anisotropy as a piezoelectric characteristic.

18. The piezoelectric film according to claim 1,
wherein the polymer material contains a cyanoethyl group.

19. The piezoelectric film according to claim 18,
wherein the polymer material is cyanoethylated polyvinyl alcohol.

20. The piezoelectric film according to claim 1,
wherein the piezoelectric particles consist of ceramic particles having a perovskite-type or wurtzite-type crystal structure.

* * * * *